(12) United States Patent
Cernea

(10) Patent No.: US 7,193,898 B2
(45) Date of Patent: Mar. 20, 2007

(54) COMPENSATION CURRENTS IN NON-VOLATILE MEMORY READ OPERATIONS

(75) Inventor: Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 54 days.

(21) Appl. No.: 11/157,033

(22) Filed: Jun. 20, 2005

(65) Prior Publication Data

US 2006/0285391 A1 Dec. 21, 2006

(51) Int. Cl.
*G11C 11/34* (2006.01)

(52) U.S. Cl. ............... 365/185.22; 365/185.17; 365/189.01

(58) Field of Classification Search ......... 365/185.22, 365/185.17, 189.01, 189.04, 189.07
See application file for complete search history.

(56) References Cited

U.S. PATENT DOCUMENTS

| 5,798,967 | A | 8/1998 | Sarin et al. |
|---|---|---|---|
| RE36,579 | E | 2/2000 | Pascucci et al. |
| 6,118,702 | A | 9/2000 | Shieh et al. |
| 6,327,194 | B1 | 12/2001 | Kurihara et al. |
| 6,359,821 | B1 | 3/2002 | Roohparvar et al. |
| 6,529,398 | B1 | 3/2003 | Nair et al. |
| 6,687,161 | B2 | 2/2004 | Marotta et al. |
| 6,754,106 | B1 | 6/2004 | Wu et al. |
| 6,798,705 | B2 | 9/2004 | Baker |
| 6,813,190 | B2 | 11/2004 | Marotta et al. |
| 6,816,403 | B1 | 11/2004 | Brennan et al. |
| 6,847,555 | B2 * | 1/2005 | Toda ............... 365/185.21 |
| 6,885,600 | B2 | 4/2005 | Tran et al. |
| 7,038,960 | B2 | 5/2006 | Tran et al. |
| 7,099,194 | B2 * | 8/2006 | Tu et al. ........... 365/185.18 |
| 2002/0051383 | A1 | 5/2002 | Mangan et al. |
| 2004/0057285 | A1 | 3/2004 | Cernea et al. |
| 2004/0057318 | A1 | 3/2004 | Cernea |
| 2004/0109357 | A1 | 6/2004 | Cernea et al. |
| 2005/0162913 | A1 | 7/2005 | Chen et al. |
| 2005/0210184 | A1 | 9/2005 | Chen et al. |
| 2006/0140011 | A1 | 6/2006 | Fong et al. |

* cited by examiner

*Primary Examiner*—Anh Phung
*Assistant Examiner*—Dang Nguyen
(74) *Attorney, Agent, or Firm*—Vierra Magen Marcus & DeNiro LLP

(57) ABSTRACT

Shifts in the apparent charge stored on a floating gate of a non-volatile memory cell can occur because of coupling of an electric field based on the charge stored in adjacent floating gates. The shift in apparent charge can lead to erroneous readings by raising the apparent threshold voltage, and consequently, lowering the sensed conduction current of a memory cell. The read process for a selected memory cell takes into account the state of one or more adjacent memory cells. If an adjacent memory cell is in one or more of a predetermined set of programmed states, a compensation current can be provided to increase the apparent conduction current of the selected memory cell. An initialization voltage is provided to the bit line of the programmed adjacent memory cell to induce a compensation current between the bit line of the programmed adjacent memory cell and the bit line of the selected memory cell.

56 Claims, 21 Drawing Sheets

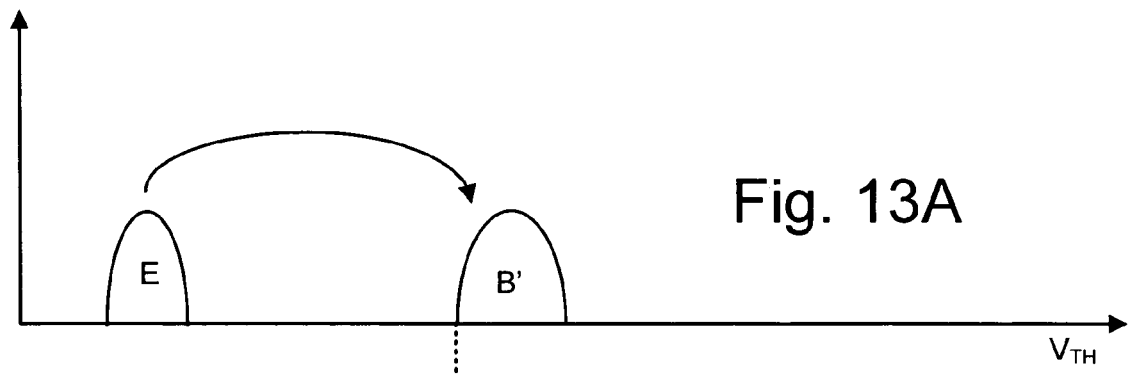
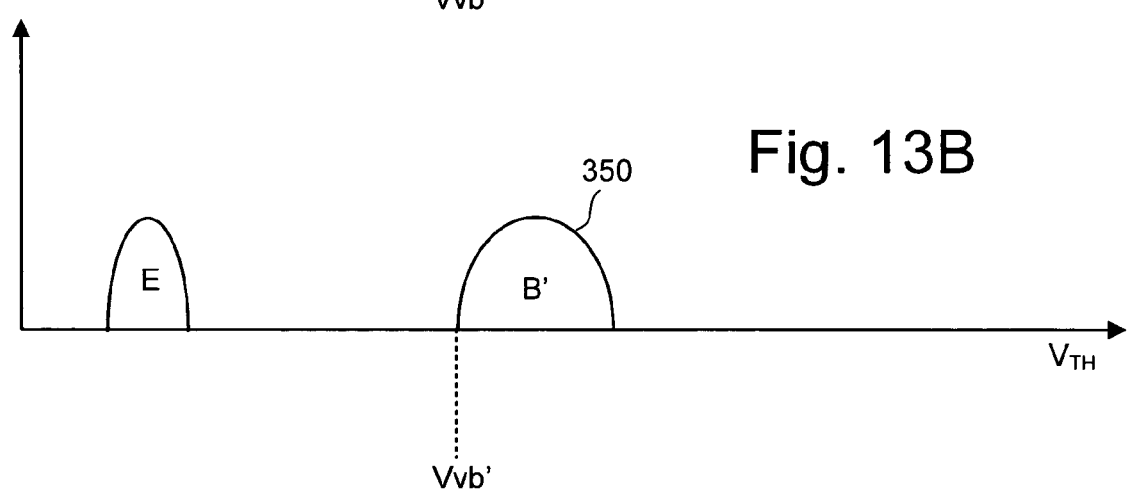
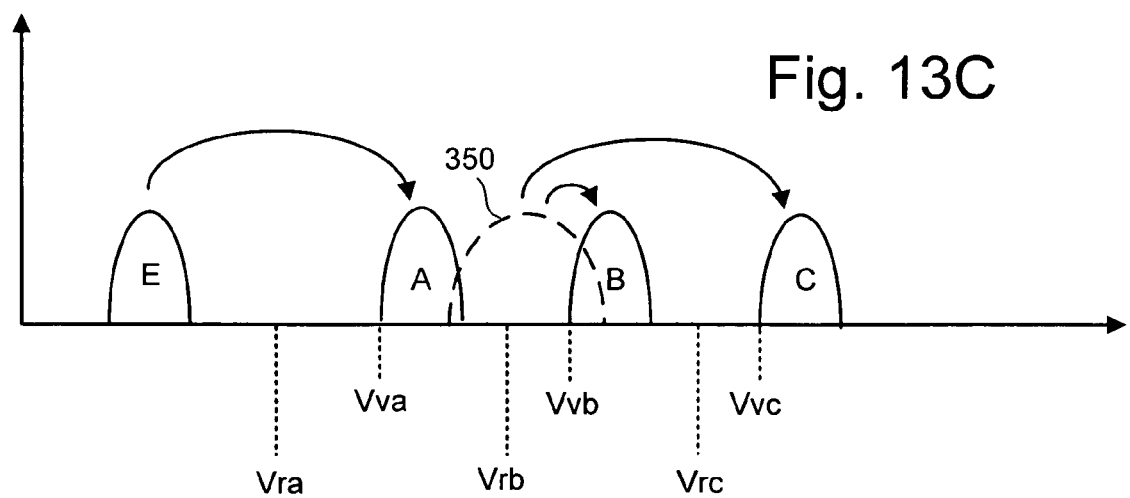

programmed population under study population of adjacent memory cells

COMPENSATION CURRENTS IN NON-VOLATILE MEMORY READ OPERATIONS

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM), including flash EEPROM, and Electrically Programmable Read Only Memory (EPROM) are among the most popular non-volatile semiconductor memories.

EEPROM and EPROM are non-volatile memories that can be erased and have new data written or "programmed" into their memory cells. Both utilize a floating gate in a transistor structure that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. For a given level charge on the floating gate, there is a corresponding threshold voltage that must be applied to the control gate before the transistor is turned "on" to permit conduction between its source and drain regions.

The floating gate can hold a range of charges and therefore, can be programmed to any threshold voltage level within a threshold voltage window. The size of the threshold voltage window is delimited by the minimum and maximum threshold levels of the device, which in turn correspond to the range of the charges that can be programmed onto the floating gate. The threshold voltage window generally depends on the memory device's characteristics, operating conditions, and history. Each distinct, resolvable threshold voltage level range within the window can, in principle, be used to designate a definite memory state of the cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

When programming an EEPROM, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. patent application Ser. No. 10/379,608, titled "Self-Boosting Technique," filed on Mar. 5, 2003 and U.S. patent application Ser. No. 10/629,068, titled "Detecting Over Programmed Memory," filed on Jul. 29, 2003, both of which are incorporated herein by reference in their entirety.

Shifts in the apparent charge stored on a floating gate can occur because of coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or neighboring floating gates that are on both a neighboring bit line and neighboring word line, and thus, across from each other in a diagonal direction.

The floating gate to floating gate coupling phenomena occurs most pronouncedly, although not exclusively, between sets of adjacent memory cells that have been programmed at different times. For example, a first memory cell can be programmed to add a level of charge to its floating gate that corresponds to a set of data. Subsequently, one or more adjacent memory cells are programmed to add a level of charge to their floating gates that correspond to a set of data. After one or more of the adjacent memory cells are programmed, the charge level read from the first memory cell may appear to be different than when it was programmed because of the effect of the charge on the adjacent memory cell(s) being coupled to the first memory cell. The coupling from adjacent memory cells can shift the apparent charge level being read from a selected memory cell by a sufficient amount to lead to an erroneous reading of the data stored.

The effect of the floating gate to floating gate coupling is of greater concern for multi-state devices because in multi-state devices the allowed threshold voltage ranges and the forbidden ranges (range between two distinct threshold voltage ranges that represent distinct memory states) are narrower than in binary devices. Therefore, floating gate to floating gate coupling can result in memory cells being shifted from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multi-state memories than binary memories using only two states. Furthermore, the reduction of the space between word lines and between bit lines will also increase the coupling between adjacent floating gates.

Thus, there is a need to have a non-volatile memory that effectively manages the aforementioned problems of floating gate coupling.

SUMMARY OF THE INVENTION

The read process for a selected memory cell takes into account the state of one or more adjacent memory cells. If an adjacent memory cell is in one or more of a predetermined set of programmed states, a compensation current can be provided to increase the apparent conduction current of the selected memory cell. An initialization voltage is provided to the bit line of the programmed adjacent memory cell to induce a current between the bit line of the adjacent memory cell and the bit line of the selected memory cell. Various initialization voltages and sampling periods during sensing can be used based on the actual state of a programmed adjacent memory cell.

In one embodiment, a method of reading data from non-volatile storage is provided that includes reading a first non-volatile storage element of a first group of non-volatile storage elements to determine whether the first non-volatile storage element is programmed to a first programmed state. If the first non-volatile storage element is determined to be in the first programmed state, an initialization voltage is provided to a bit line of the first group. By providing the initialization voltage, a first current results in the bit line of a second group. If the first non-volatile storage element is programmed, a second non-volatile storage element of the second group is read while the first current is in the bit line of the second group.

More than one state can be considered during reading the first non-volatile storage element and an initialization voltage provided if the first non-volatile storage element is in any of the considered states. The same initialization voltage and recovery time can be used during sensing or various initialization voltages and recovery times can be used based on the actual state of the first non-volatile storage element. Moreover, additional non-volatile storage elements can be read to determine whether the initialization voltage or additional initialization voltages should be provided. In one embodiment, the first group of non-volatile storage elements is a first NAND string and the second group of non-volatile storage elements is a second NAND string adjacent to the first NAND string.

Embodiments have application in numerous types of memory architectures using numerous types of programming and reading. By way of non-limiting example, embodiments including an all bit line architecture or an odd/even architecture can be used. In either of these architectures, memories cells programmed using full sequence programming, various types of upper/lower page programming, and other programming techniques can be read using the principles embodied herein.

In one embodiment, a non-volatile memory system is provided that includes a first group of non-volatile storage elements coupled to a first bit line, a second group of non-volatile storage elements coupled to a second bit line, and at least one sense block in communication with the first group of non-volatile storage elements and the second group of non-volatile storage elements. The at least one sense block reads a first non-volatile storage element of the first group of non-volatile storage elements to determine whether the first non-volatile storage element is programmed to a first programmed state and provides an initialization voltage to the first bit line if the first non-volatile storage element is determined to be in the first programmed state. The initialization voltage results in a first current in the second bit line. The at least one sense block reads a second non-volatile storage element of the second group while the second current is in the second bit line if the first non-volatile storage element is programmed to the first programmed state.

BRIEF DESCRIPTION OF THE DRAWINGS

FIGS. 13A–13C show exemplary threshold voltage distributions and describe an exemplary process for programming non-volatile memory.

DETAILED DESCRIPTION

Figure 1:
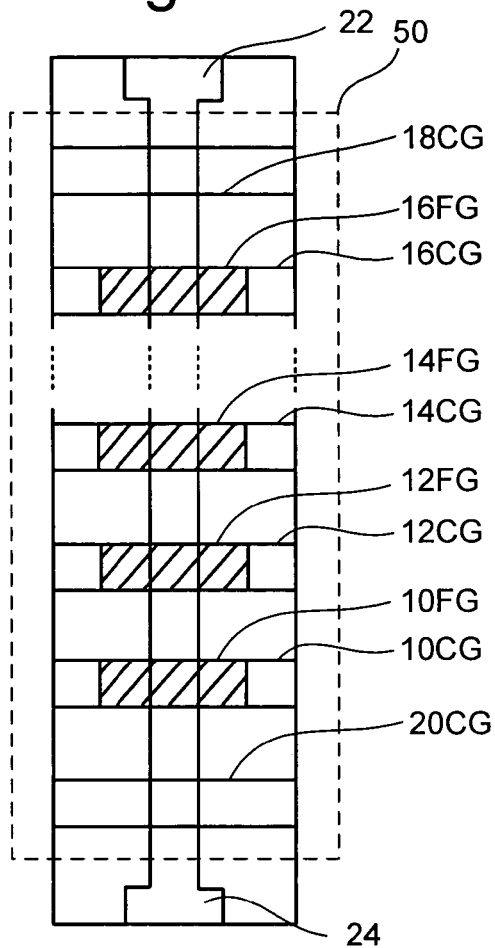
FIG. 1 is a top view of a NAND string.
Figure 2:
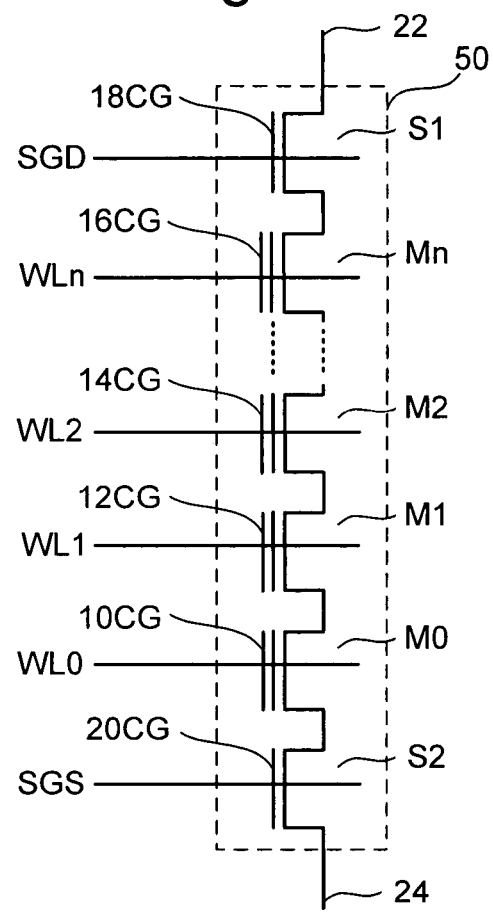
FIG. 2 is an equivalent circuit diagram of the NAND string.

One example of a memory system suitable for implementing embodiments of the present invention uses the NAND flash memory structure, which includes arranging multiple transistors in series between two select gates. The transistors in series and the select gates are referred to as a NAND string. FIG. 1 is a top view showing an exemplary NAND string 50. FIG. 2 is an equivalent circuit thereof. The NAND string depicted in FIGS. 1 and 2 includes transistors, M0, M1, M2, and Mn, in series and sandwiched between a first select gate S1 and a second select gate S2. In one embodiment, transistors M0, M1, M2, and Mn each form an individual memory cell of the NAND string. In other embodiments, the memory cells of a NAND string may include multiple transistors or may be different than that depicted in FIGS. 1 and 2. The memory cell Mn is labeled as such to indicate that a NAND string can include any number (n) memory cells, be it less than or greater than four as depicted (e.g., 2, 8, 16, 32, etc.). The discussion herein is not limited to any particular number of memory cells in a NAND string. Select gate S1 connects the NAND string to drain terminal 22 which is in turn connected to a bit line (not shown). Select gate S2 connects the NAND string to source terminal 24 which is in turn connected to a source line (not shown). Select gate S1 is controlled by applying the appropriate voltages to control gate 18CG via select line SGD and select gate S2 is controlled by applying the appropriate voltages to control gate 20CG via select line SGS. Each of the transistors M0, M1, M2, and Mn has a control gate and a floating gate. Transistor M0 includes control gate 10CG and floating gate 10FG. Transistor M1 includes control gate 12CG and floating gate 12FG. Transistor M2 includes control gate 14CG and floating gate 14FG. Transistor Mn includes control gate 16CG and floating gate 16FG. Control gate 10CG is connected to word line WL0, control gate 12CG is connected to word line WL1, control gate 14CG is connected to word line WL2, and control gate 16CG is connected to word line WLn.

Figure 3:
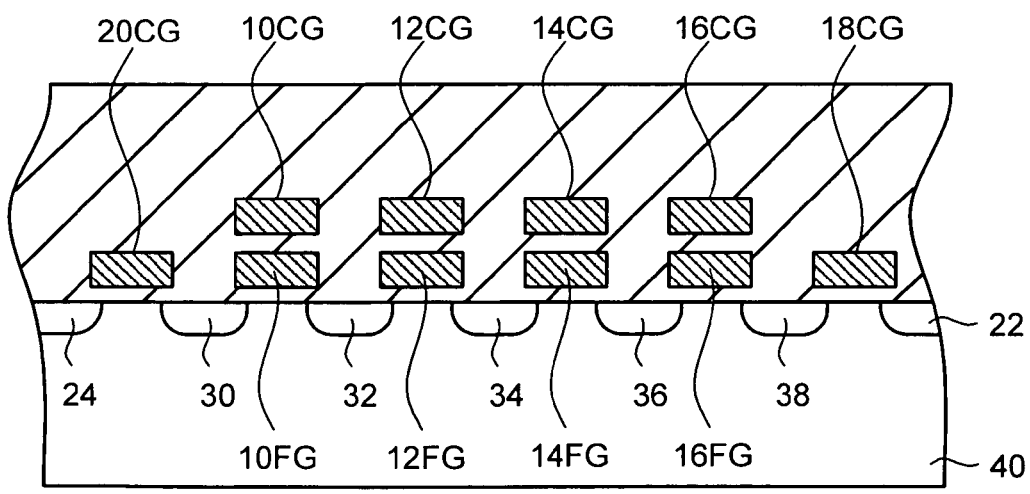
FIG. 3 is a cross-sectional view of the NAND string.

FIG. 3 provides a cross-sectional view of the NAND string described above, wherein it is assumed that there are four memory cells in the NAND string. Again, the discussion herein is not limited to any particular number of memory cells in a NAND string. As depicted in FIG. 3, the transistors of the NAND string are formed in p-well region 40. Each transistor includes a stacked gate structure that consists of a control gate (10CG, 12CG, 14CG and 16CG) and a floating gate (10FG, 12FG, 14FG and 16FG). The floating gates are formed on the surface of the p-well on top of an oxide or other dielectric film. The control gate is above the floating gate, with an inter-polysilicon dielectric layer separating the control gate and floating gate. The control gates of the memory cells (M0, M1, M2 and Mn) form the word lines. N+ doped layers 30, 32, 34, 36 and 38 are shared between neighboring cells, whereby the cells are connected to one another in series to form a NAND string. These N+ doped layers form the source and drain of each of the elements of the string. For example, N+ doped layer 30 serves as the drain of transistor S2 and the source for transistor M0, N+ doped layer 32 serves as the drain for transistor M0 and the source for transistor M1, N+ doped layer 34 serves as the drain for transistor M1 and the source for transistor M2, N+ doped layer 36 serves as the drain for transistor M2 and the source for transistor Mn, and N+ doped layer 38 serves as the drain for transistor Mn and the source for transistor S1. N+ doped layer 22 forms the drain terminal and connects to a common bit line for multiple NAND strings, while N+ doped layer 24 forms the source terminal and connects to a common source line for multiple NAND strings.

Each memory cell can store data represented in analog or digital form. When storing one bit of digital data, the range of possible threshold voltages of the memory cell is divided into two ranges which represent distinct memory states. The memory states are assigned logical data "1" and "0." At least one current breakpoint level is generally established so as to partition the conduction window of the memory cell into the two ranges. When the cell is read by applying predetermined, fixed voltages, its source/drain conduction current is resolved into one of the memory states by comparing it with the breakpoint level (or reference current). If the current read is higher than that of the breakpoint level, the cell is determined to be "on" and in one logical state. If the current is less than the breakpoint level, the cell is determined to be "off" and in the other logical state. In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on to indicate that logic zero is being stored.

A memory cell can also store multiple bits of digital data by utilizing more than two ranges of threshold voltages to represent distinct memory states. The threshold voltage window can be divided into the number of desired memory states and multiple breakpoint levels used to resolve the individual states. For example, if four states are used, there will be four threshold voltage ranges representing four distinct memory states which are assigned the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of non-volatile memory in addition to NAND flash memory can also be used in accordance with embodiments.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93–95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497–501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543–545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
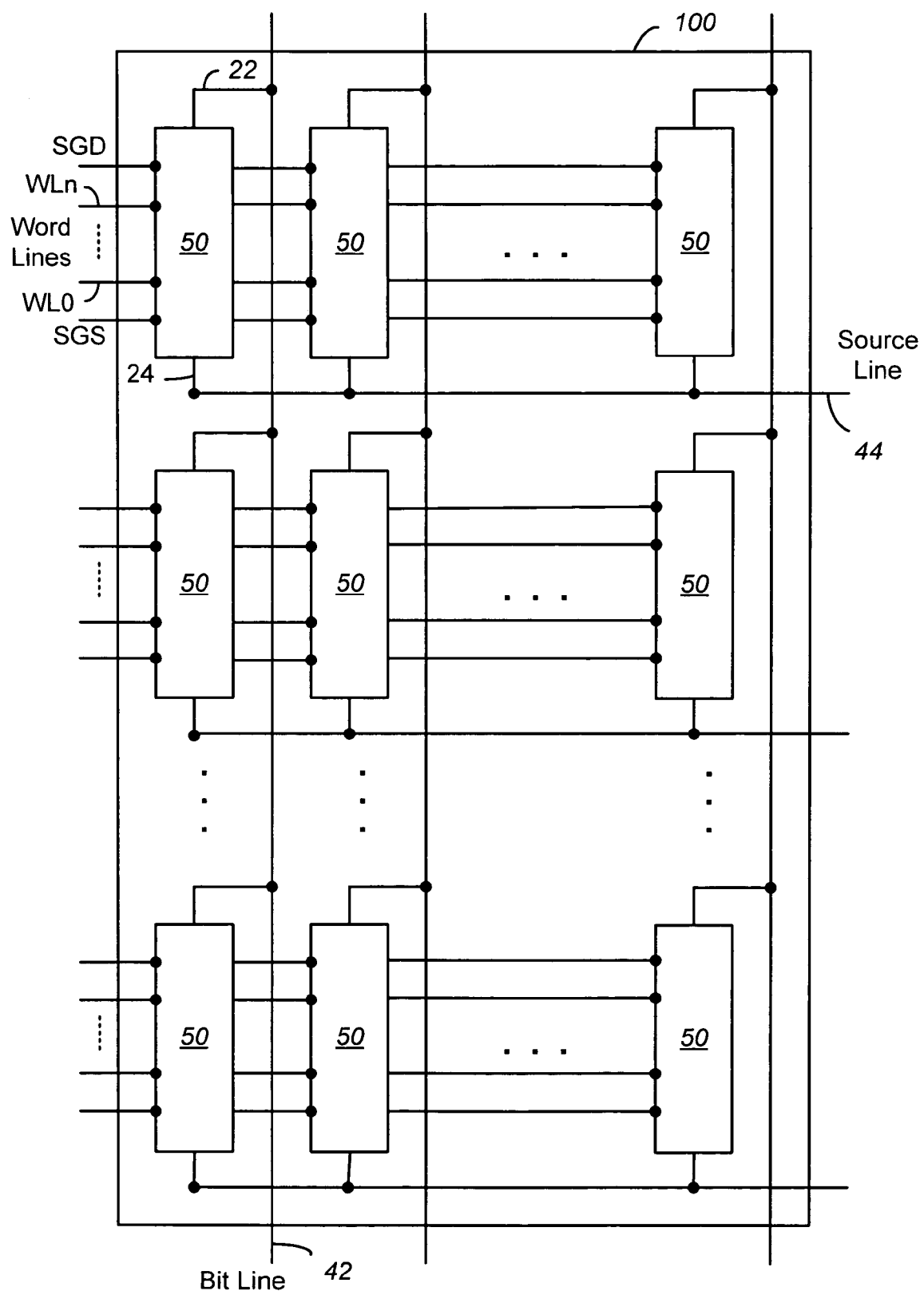
FIG. 4 is a block diagram of an array of NAND flash memory cells.

FIG. 4 illustrates an example of an array 100 of NAND strings 50, such as those shown in FIGS. 1–3. Along each column, a bit line 42 is coupled to the drain terminal, e.g. 22 of the drain select gate for the NAND string 50. Along each row of NAND strings, a source line 44 may connect all the source terminals, e.g. 24 of the source select gates of the NAND strings. An example of a NAND architecture array and its operation as part of a memory system is found in U.S. Pat. Nos. 5,570,315; 5,774,397; and 6,046,935, all of which are incorporated herein by reference in their entirety.

The array 100 of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming or reading, although more than one page may be programmed or read in a single operation. In one embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16–20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
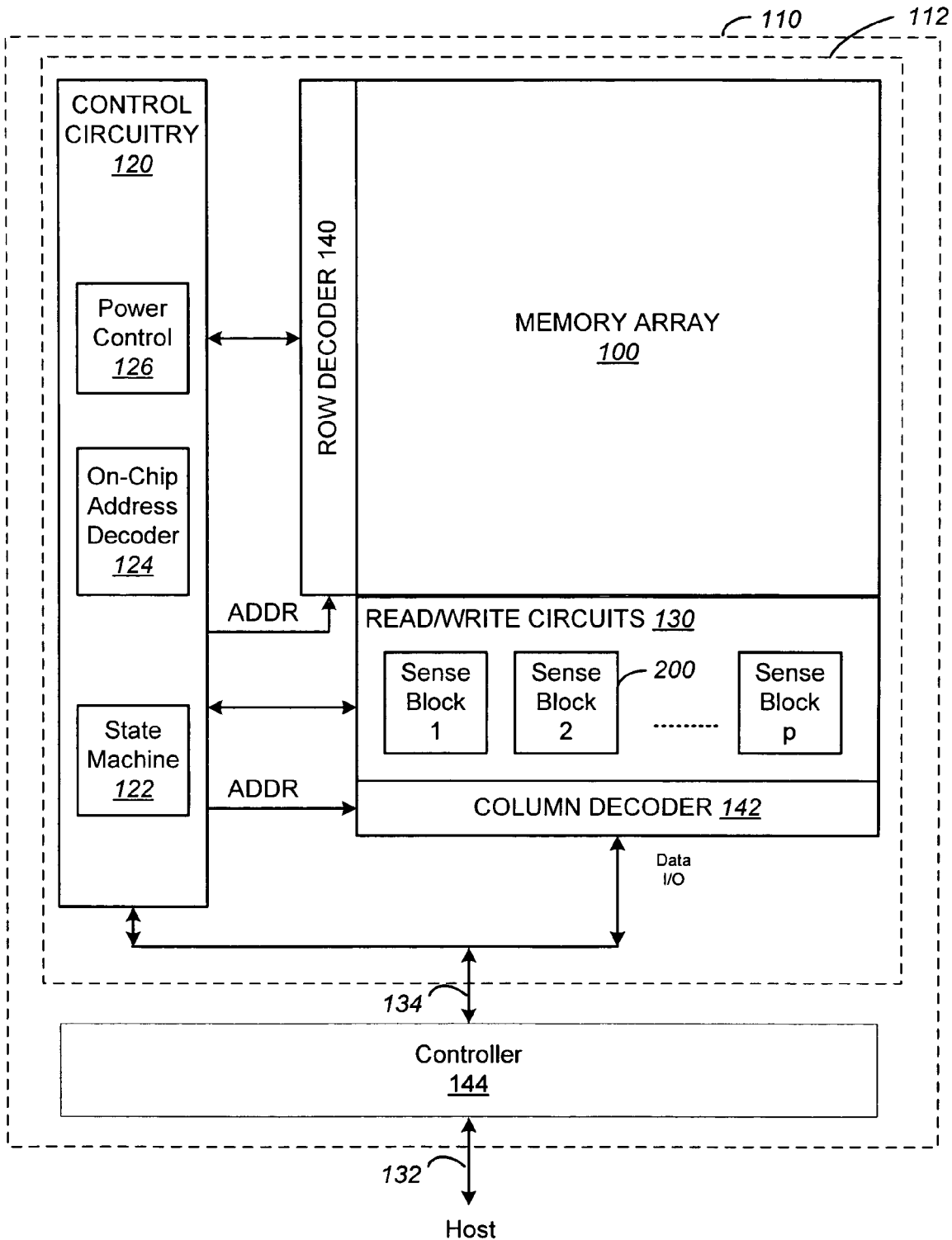
FIG. 5 is a block diagram of a non-volatile memory system.

FIG. 5 illustrates a memory device 110 having read/write circuits for reading and programming a page of memory cells in parallel, according to one embodiment. Memory device 110 may include one or more memory die 112. Memory die 112 includes a two-dimensional array of memory cells 100, control circuitry 120, and read/write circuits 130. The memory array 100 is addressable by word lines via a row decoder 140 and by bit lines via a column decoder 142. The read/write circuits 130 include multiple sense blocks 200 and allow a page of memory cells to be read or programmed in parallel. Typically a controller 144 is included in the same memory device 110 (e.g., a removable storage card) as the one or more memory die 112. Commands and Data are transferred between the host and controller 144 via lines 132 and between the controller and the one or more memory die 112 via lines 134.

The control circuitry 120 cooperates with the read/write circuits 130 to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140 and 130. The power control module 126 controls the power and voltages supplied to the word lines and bit lines during memory operations.

Figure 6:
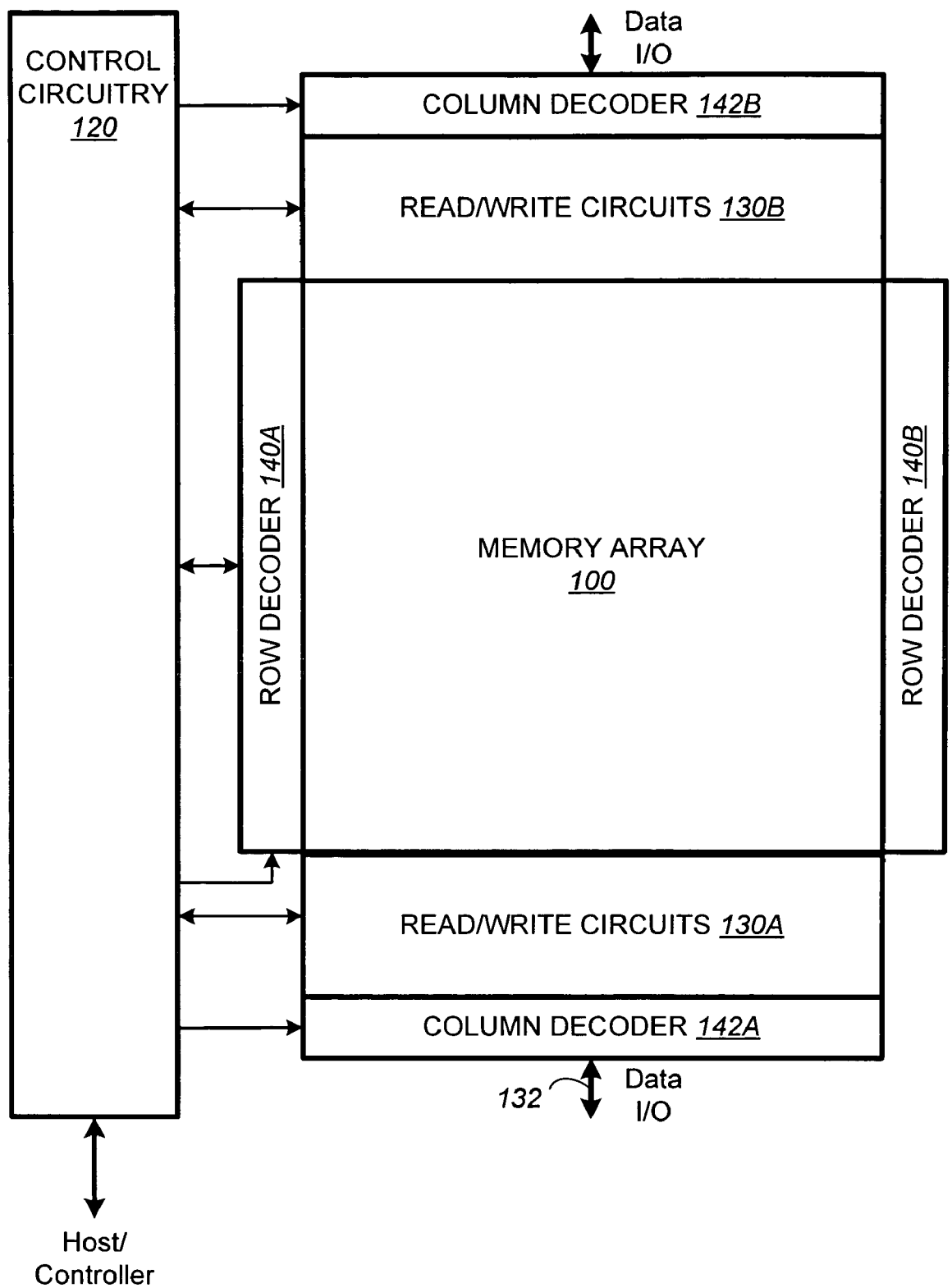
FIG. 6 is a block diagram of a non-volatile memory system.

FIG. 6 illustrates another arrangement of the memory device 110 shown in FIG. 5. Access to the memory array 100 by the various peripheral circuits is implemented in a symmetric fashion, on opposite sides of the array, so that the densities of access lines and circuitry on each side are reduced by half. Thus, the row decoder is split into row decoders 140A and 140B and the column decoder into column decoders 142A and 142B. Similarly, the read/write circuits are split into read/write circuits 130A connecting to bit lines from the bottom and read/write circuits 130B connecting to bit lines from the top of the array 100. In this way, the density of the read/write modules is essentially reduced by one half. The device of FIG. 6 can also include a controller, as described above for the device of FIG. 5.

Figure 7:
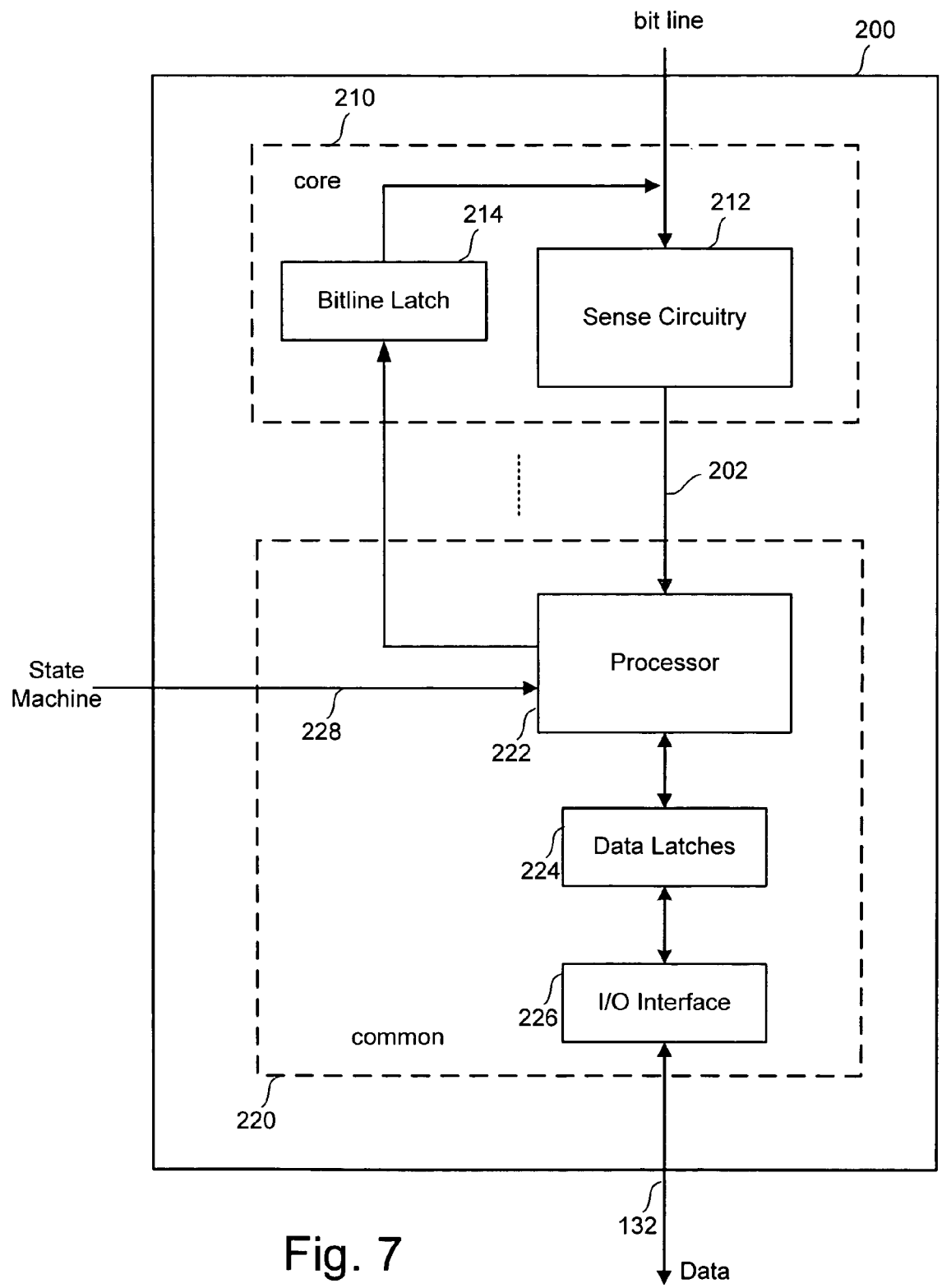
FIG. 7 is a block diagram depicting one embodiment of a sense block of FIGS. 5 and 6.

FIG. 7 is a block diagram of an individual sense block 200 partitioned into a core portion, referred to as a sense module 210, and a common portion 220. In one embodiment, there will be a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 202. For further details, refer to U.S. patent application Ser. No. 11/026,536, entitled "Non-Volatile Memory & Method with Shared Processing for an Aggregate of Sense Amplifiers," filed on Dec. 29, 2004 and incorporated by reference herein in its entirety.

Sense module 210 comprises sense circuitry 212 that determines whether a conduction current in a connected bit line is above or below a predetermined threshold level. Sense module 210 also includes a bit line latch 214 that is used to set a voltage condition on the connected bit line. For example, a predetermined state latched in bit line latch 214 will result in the connected bit line being pulled to a state designating program inhibit (e.g., Vdd).

Common portion 220 comprises a processor 222, a set of data latches 224 and an I/O Interface 226 coupled between the set of data latches 224 and data bus 132. Processor 222 performs computations. For example, one of its functions is to determine the data stored in the sensed memory cell and store the determined data in the set of data latches. Processor 222 can also perform certain functions dependent upon instructions from the state machine and/or data in latches 224, for example, setting appropriate conditions in bit line latch 214 based on the type of operation being performed. The set of data latches 224 is used to store data bits determined by processor 222 during a read operation. It is also used to store data bits imported from the data bus 132 during a program operation. The imported data bits represent write data meant to be programmed into the memory. I/O interface 226 provides an interface between data latches 224 and the data bus 132.

During read or sensing, the operation of the system is under the control of state machine 122 that controls the supply of different control gate voltages to the addressed cell. As it steps through the various predefined control gate voltages corresponding to the various memory states supported by the memory, the sense module 210 will trip at one of these voltages and an output will be provided from sense module 210 to processor 222 via bus 202. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 214 serves double duty, both as a latch for latching the output of the sense module 210 and also as a bit line latch as described above.

It is anticipated that some implementations will include multiple processors 222. In one embodiment, each processor 222 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one inverted). When all bits output a data 0 (or a data one inverted), then the state machine knows to terminate the programming process. Because each processor communicates with eight sense modules, the state machine needs to read the wired-OR line eight times.

During program or verify, the data to be programmed is stored in the set of data latches 224 from the data bus 132. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate. In other embodiments the processor initially loads the bit line latch 214 and the sense circuitry sets it to an inhibit value during the verify process.

Data latch stack 224 contains a stack of data latches corresponding to the sense module. In one embodiment, there are three data latches per sense module 210. For example, there can be a lower data latch for storing data for a lower page read or write, an upper data latch for storing data for an upper page read or write, and one additional latch. Additional or fewer data latches can be used according to specific implementations in accordance with embodiments. In some implementations (but not required), the data latches are implemented as a shift register so that the parallel data stored therein is converted to serial data for data bus 132, and vice versa. In one embodiment, all the data latches corresponding to the read/write block of n memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 8:
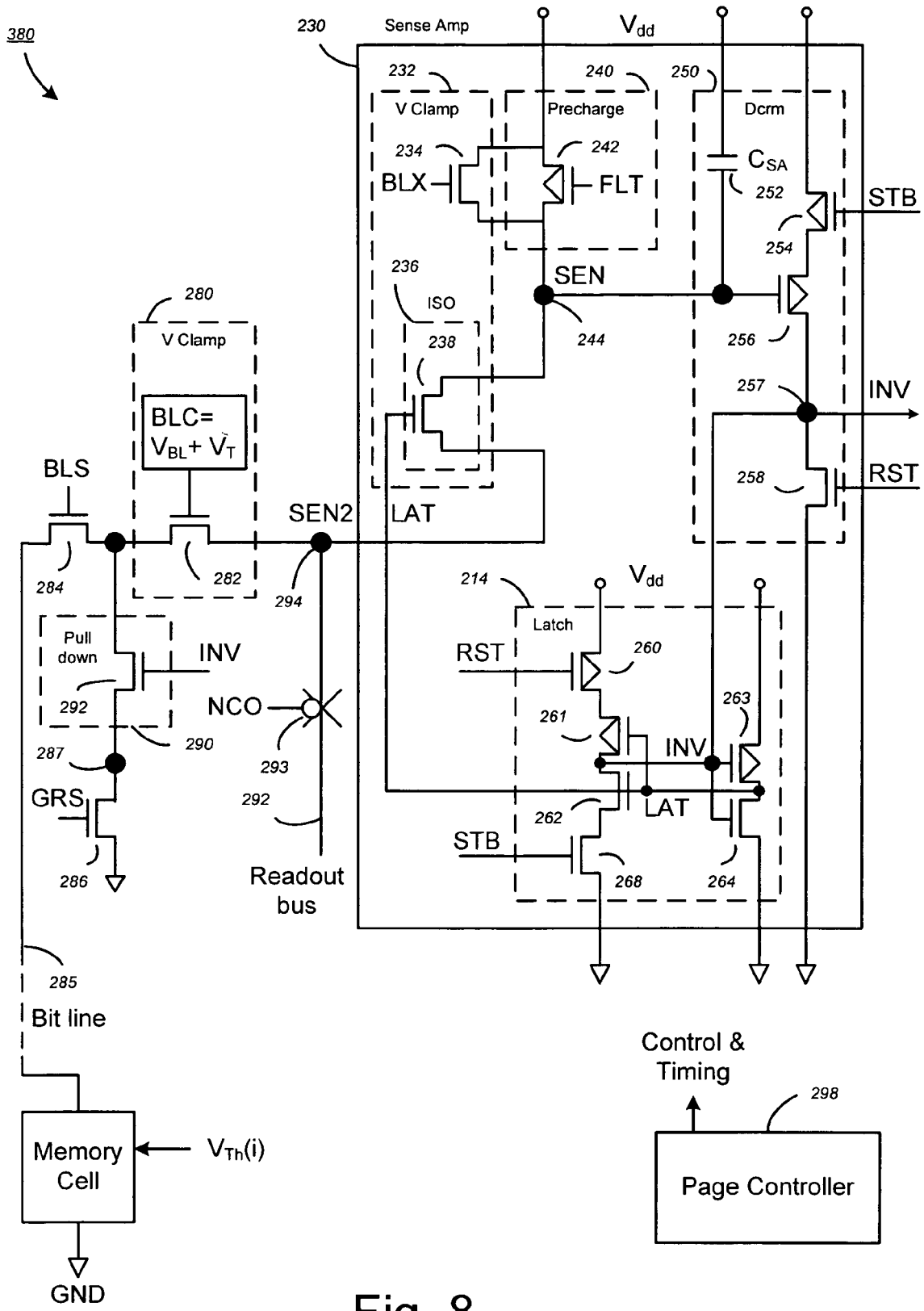
FIG. 8 is a schematic diagram of one embodiment of a sense module of FIG. 7.

FIG. 8 illustrates an example of sense module 210, however, other implementations can also be used in accordance with embodiments. Sense module 210 comprises a bit line isolation transistor 284, bit line pull down circuit 290, bit line voltage clamp 280, readout bus transfer gate 293 and a sense amplifier 230 which in this implementation contains bitline latch 214. Note that the memory cell and page controller 298 in FIG. 8 are associated with but not structurally a part of sense module 210.

In general, a page of memory cells is operated on in parallel. Therefore a corresponding number of sense modules are in operation in parallel. In one embodiment, page controller 298 expediently provides control and timing signals to the sense modules operated in parallel.

Sense module 210 is connectable to the bit line 285 of a memory cell when the bit line isolation transistor 284 is enabled by a signal BLS. Sense module 210 senses the conduction current of the memory cell by means of sense amplifier 230 and latches the read result as a digital voltage level SEN2 at a sense node 294 and outputs it to a readout bus 292 via gate 293.

The sense amplifier 230 essentially comprises a second voltage clamp 232, a precharge circuit 240, a discriminator or compare circuit 250 and a latch 214. The discriminator circuit 250 includes a dedicated capacitor 252. In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN 244 to decrease, effectively charging or increasing the voltage across capacitor 252 whose other terminal is at Vdd. If the voltage on node SEN discharges to a predetermined level during a predetermined sensing period, then sense amplifier 230 reports that the memory cell turned on in response to the control gate voltage.

One feature of the sense module 210 is the incorporation of a constant voltage supply to the bit line during sensing. This is preferably implemented by the bit line voltage clamp 280. The bit line voltage clamp 280 operates like a diode clamp with transistor 282 in series with the bit line 285. Its gate is biased to a constant voltage BLC equal to the desired bit line voltage VBL above its threshold voltage VT. In this way, it isolates the bit line from the sense node 294 and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors.

The sense amplifier 230 senses the conduction current through the sense node 294 and determines whether the conduction current is above or below a predetermined value. The sense amplifier outputs the sensed result in a digital form as the signal SEN2 at the sense node 294 to the readout bus 292.

The digital control signal INV, which is essentially an inverted state of the signal SEN2 after read, is also output to control the pull down circuit 290. When the sensed conduction current is higher than the predetermined value, INV will be HIGH and SEN2 will be LOW. This result is reinforced by the pull down circuit 290. Pull down circuit 290 includes an n-transistor 292 controlled by the control signal INV and another n-transistor 286 controlled by the control signal GRS. The GRS signal when LOW allows the bit line 285 to be floated regardless of the state of the INV signal. During programming, the GRS signal goes HIGH to allow the bit line 285 to be pulled to ground and controlled by INV. When the bit line is required to be floated, the GRS signal goes LOW.

Figure 9:
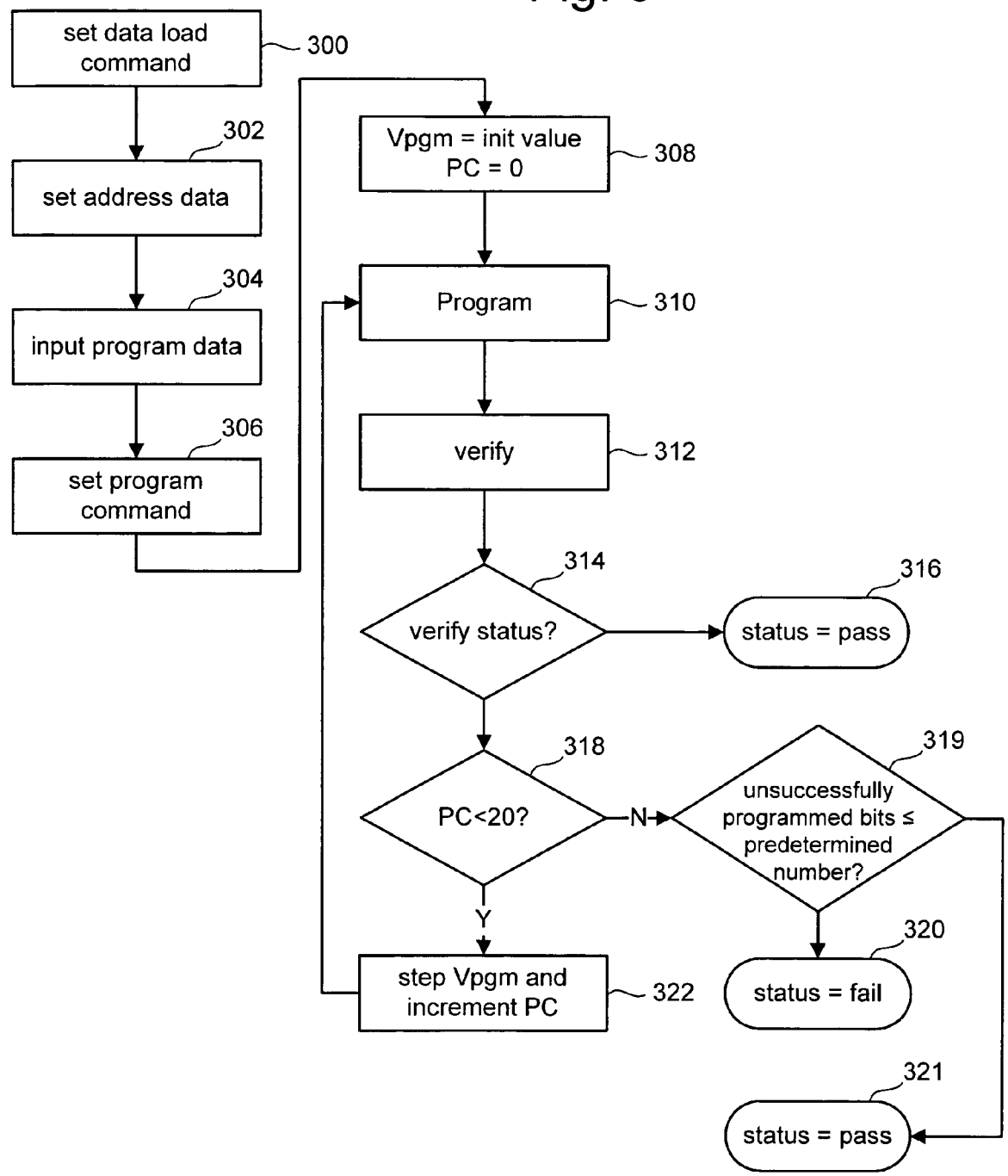
FIG. 9 is a flow chart describing one embodiment of a process for programming non-volatile memory.

FIG. 9 is a flow chart describing one embodiment of a method for programming non-volatile memory. In one implementation, memory cells are erased (in blocks or other units) prior to programming. In step 300 of FIG. 9, a "data load" command is issued by the controller and input received by control circuitry 120. In step 302, address data designating the page address is input to decoder 124 from the controller or host. In step 304, a page of program data for the addressed page is input to a data buffer for programming. That data is latched in the appropriate set of data latches 224. In step 306, a "program" command is issued by the controller to state machine 122.

Figure 10:
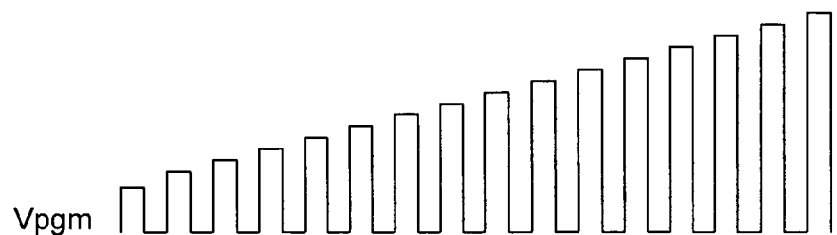
FIG. 10 is an exemplary wave form applied to the control gates of non-volatile memory cells.

Triggered by the "program" command, the data latched in step 304 will be programmed into the selected memory cells controlled by state machine 122 using the stepped pulses of FIG. 10 applied to the appropriate word line. In step 308, Vpgm, the programming pulse voltage level applied to the selected word line, is initialized to the starting pulse (e.g., 12V) and a program counter PC maintained by state machine 122 is initialized at 0. In step 310, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

In step 312, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected cells have been programmed. In step 314, it is checked whether all of the data latches are storing logic "1." If so, the programming process is complete and successful because all selected memory cells were programmed and verified to their target states. A status of "PASS" is reported in step 316.

If, in step 314, it is determined that not all of the data latches are storing logic "1," then the programming process continues. In step 318, the program counter PC is checked against a program limit value. One example of a program limit value is 20, however, other values can be used in various implementations. If the program counter PC is not less than 20, then it is determined at step 319 whether the number of bits that have not been successfully programmed is equal to or less than a predetermined number. If the number of unsuccessfully programmed bits is equal to or less than the predetermined number, then the programming process is flagged as passed and a status of pass is reported at step 321. The bits that are not successfully programmed can be corrected using error correction during the read process. If however, the number of unsuccessfully programmed bits is greater than the predetermined number, the program process is flagged as failed and a status of fail is reported at step 320. If the program counter PC is less than 20, then the Vpgm level is increased by the step size and the program counter PC is incremented in step 322. After step 322, the process loops back to step 310 to apply the next Vpgm pulse.

Figure 11:
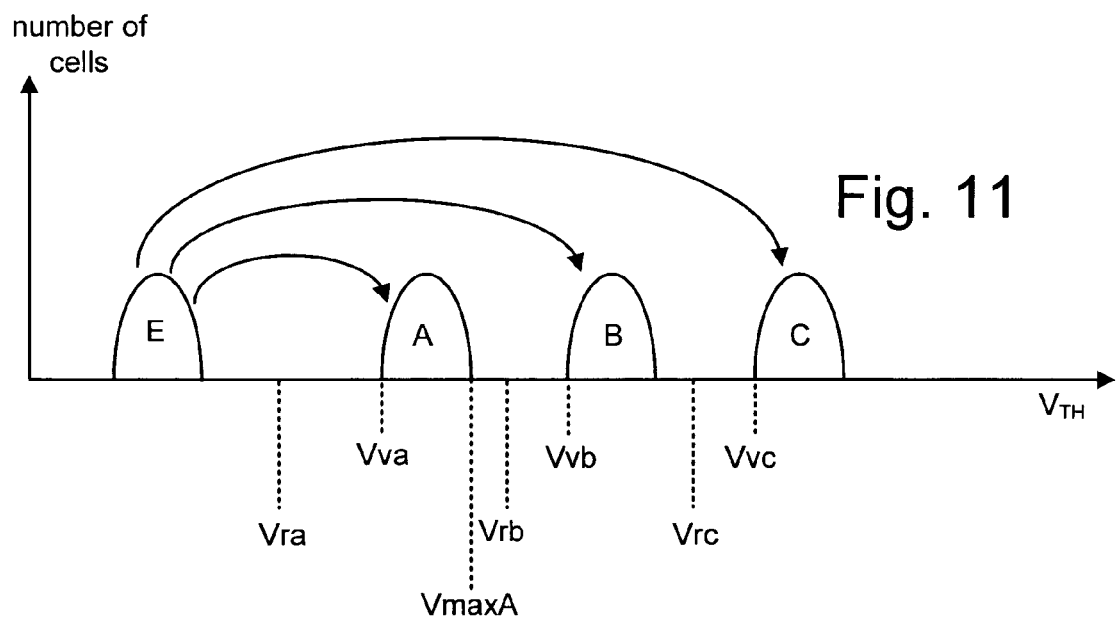
FIG. 11 depicts an exemplary set of threshold voltage distributions.

At the end of a successful program process, the threshold voltages of the memory cells should be within one or more distributions of threshold voltages for programmed memory cells or within a distribution of threshold voltages for erased memory cells, as appropriate. FIG. 11 illustrates threshold voltage distributions for the memory cell array when each memory cell stores two bits of data. FIG. 11 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 11 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present invention can also be used with other multi-state structures including those that include more or less than four states.

FIG. 11 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 11 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment as depicted in FIG. 11, known as full sequence programming, memory cells can be programmed from the erase state E directly to any of the programmed states A, B or C. For example, a population of memory cells to be programmed may first be erased so that all memory cells in the population are in erased state E. The process depicted in FIG. 9, using the control gate voltage sequence depicted in FIG. 10, will then be used to program memory cells directly into states A, B or C. While some memory cells are being programmed from state E to state A, other memory cells are being programmed from state E to state B and/or from state E to state C. In such embodiments, both bits coded for a particular memory state of a memory cell can be regarded as part of a single page of data.

Figure 12:
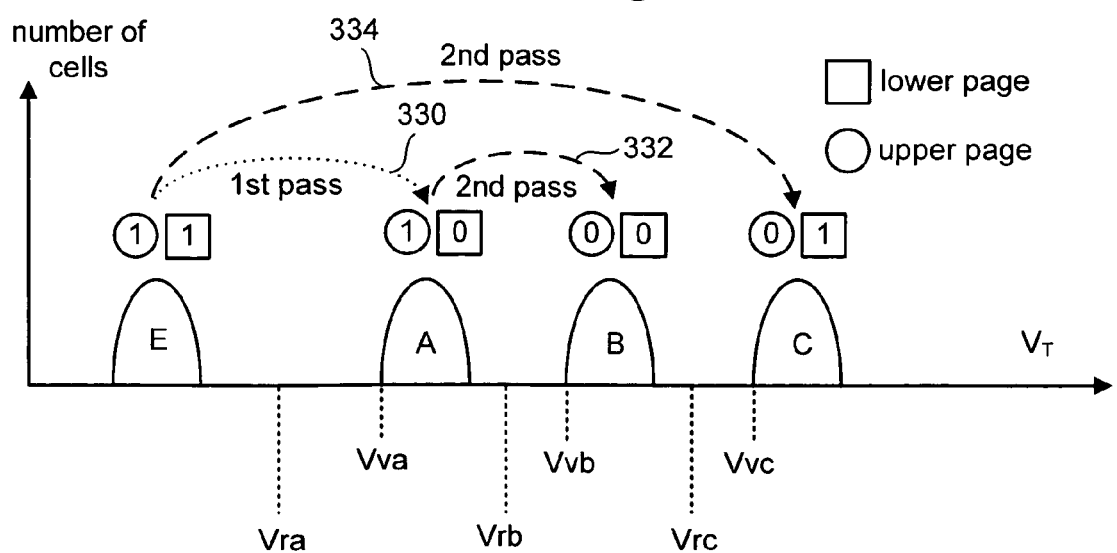
FIG. 12 depicts an exemplary set of threshold voltage distributions.

FIG. 12 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 330. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 334. If the cell had been programmed into state A as a result of the first programming pass, then the memory cell is further programmed in the second pass so that the threshold voltage is increased to be within state B, as depicted by arrow 332. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

FIGS. 13A–C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 13A–C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores data for two pages. For reference purposes these pages of data will be called upper page and lower page, however, they can be given other labels. With reference to state A for the process of FIGS. 13A–C, the upper page stores bit 0 and the lower page stores bit 1. With reference to state B, the upper page stores bit 1 and the lower page stores bit 0. With reference to state C, both pages store bit data 0. The programming process of FIGS. 13A–C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 13A therefore shows the programming of memory cells from state E to state B'. State B' depicted in FIG. 13A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, looking back at FIG. 2, after the lower page for memory cell M0 is programmed, the lower page for memory cell M1 would be programmed. After programming memory cell M1, the floating gate to floating gate coupling effect will raise the apparent threshold voltage of memory cell M0 if memory cell M1 had a threshold voltage raised from state E to state B'. This will have the effect of widening the threshold voltage distribution for state B' to that depicted as threshold voltage distribution 350 of FIG. 19B. This apparent widening of the threshold voltage distribution will be remedied when programming the upper page.

FIG. 13C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 350 and the upper page data is to remain at 1, then the memory cell will be programmed to final state B. If the memory cell is in intermediate threshold voltage distribution 350 and the upper page data is to become data 0, then the threshold voltage of the memory cell will be raised so that the memory cell is in state C. The process depicted by FIGS. 13A–C reduces the effect of floating gate to floating gate coupling because only the upper page programming of neighbor memory cells will have an effect on the apparent threshold voltage of a given memory cell. An example of an alternate state coding is to move from distribution 350 to state C when the upper page data is a 1, and to move to state B when the upper page data is a 0.

Although FIGS. 13A–C provide an example with respect to four data states and two pages of data, the concepts taught by FIGS. 13A–C can be applied to other implementations with more or less than four states and different than two pages.

Various orders of programming according to various embodiments for the methods described by FIGS. 11, 12, and 13 can be performed based on the type of programming architecture used. For example, in some embodiments, the bit lines are divided into even bit lines (BLe) and odd bit lines (BLo) in what is often referred to as an odd/even bit line architecture. For a block of memory cells in an odd/even bit line architecture, memory cells along a common word line and connected to the odd bit lines are programmed at one time, while memory cells along a common word line and connected to even bit lines are programmed at another time. In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

Examples of an architecture using odd/even bit line programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; United States Patent Application Publication US 2003/0161182; United States Patent Application Publication US 2004/0047182. Additionally, U.S. patent application Ser. No. 11\099,133, entitled "COMPENSATING FOR COUPLING DURING READ OPERATIONS OF NON-VOLATILE MEMORY," filed Apr. 5, 2005, incorporated by reference in its entirety, describes examples of full sequence and two-pass programming for both all bit line and odd/even bit line programming architectures.

One potential issue relevant to sensing memory cells is source line bias. When a large number of memory cells are sensed in parallel, their combined currents can result in significant voltage drop in a ground loop with finite resistance. This results in a source line bias which causes error in a read operation employing threshold voltage sensing. For example, if 4,256 bit lines discharge at the same time, each with a current of 1 µA, then the source line voltage drop will be equal to 4,000 lines×1 µA/line×50 ohms ~0.2 volts. This source line bias will contribute to a sensing error of 0.2 volts when threshold voltages of the memory cells are sensed. For a more complete discussion of the dynamics of source line bias, refer to U.S. patent application Ser. No. 11\099,133, entitled "COMPENSATING FOR COUPLING DURING READ OPERATIONS OF NON-VOLATILE MEMORY," filed Apr. 5, 2005, and referenced above.

According to one embodiment, reducing source line bias is accomplished by read/write circuits with features and techniques for multi-pass sensing. Each pass helps to identify and shut down the memory cells with conduction currents higher than a given demarcation current value. Typically, with each pass, the given demarcation current value progressively converges to the breakpoint current value for a conventional single-pass sensing. In this way, sensing in subsequent passes will be less affected by source line bias since the higher current cells have been shut down.

Figure 14:
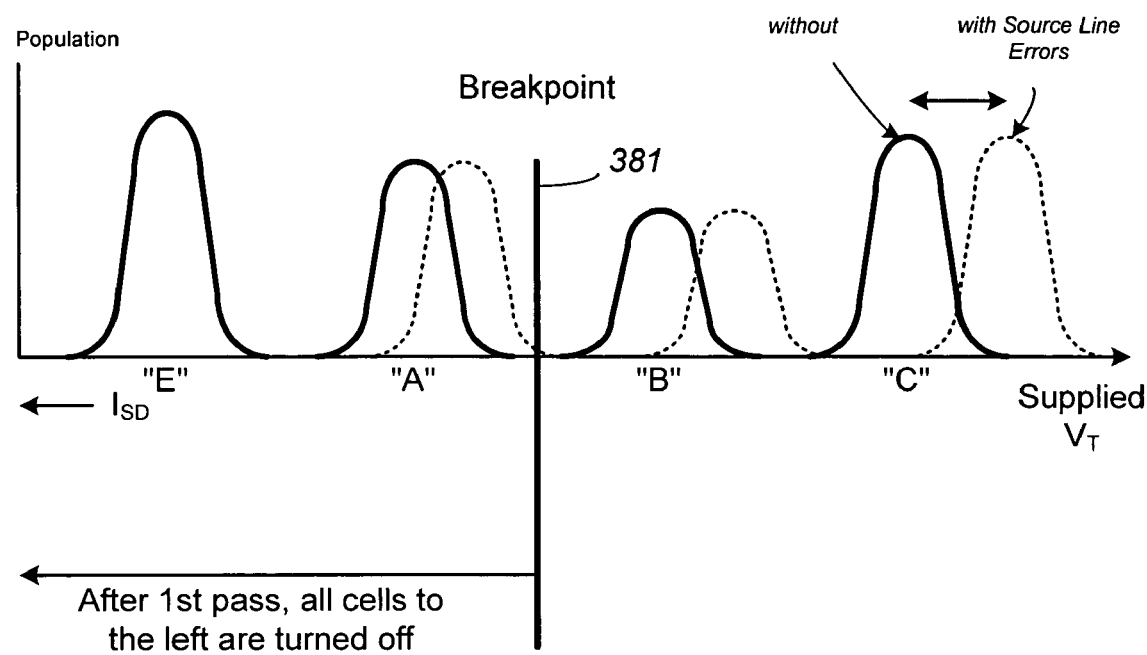
FIG. 14 shows exemplary threshold voltage distributions and the effects of source line bias.

FIG. 14 illustrates an exemplary population distribution of a page of memory cells for a 4-state memory. Each cluster of memory cells is programmed within a range of conduction currents ISD clearly separated from each other. For example, a breakpoint 381 is a demarcating current value between two clusters, respectively representing the "A" and "B" memory states. In a conventional single-pass sensing, a necessary condition for a "B" memory state will be that it has a conduction current less than the breakpoint 381. If there were no source line bias, the population distribution with respect to the supplied threshold voltage $V_T$ would be depicted by the curve with the solid line. However, because of the source line bias error, the threshold voltage of each of the memory cells at its control gate is increased by the source line bias. This means a higher control gate voltage need be applied to compensate for the bias. In FIG. 14, the source line bias results in a shifting of the distribution (broken line) towards a higher apparent $V_T$. The shifting will be more when sensing the higher threshold (lower current) memory states since more total array current is flowing due to the higher applied word line voltage. If the breakpoint 381 is designed for the case without source line error, then the existence of a source line error will have some of the tail end of "A" states having conduction currents appear in a region of no conduction, which means it would be higher than the breakpoint 381. This will result in some of the "A" states (more conducting) being mistakenly demarcated as "B" states (less conducting).

For example, the present multi-pass sensing can be implemented in two passes (j=1 to 2). After the first pass, those memory cells with conduction currents higher than the breakpoint 381 are identified and removed by turning off their conduction current. A preferred way to turn off their conduction currents is to set their drain voltages on their bit lines to ground. In a second pass (j=2), because of the removal of the high current states that contributed to the source line bias, the distribution with the broken line approaches that of the one with the solid line. Thus, sensing using the breakpoint 381 as the demarcation current value will not result in mistaking the "A" states for the "B" states.

As compared to a conventional one-pass approach, the present two-pass method substantially reduces the likelihood of misidentifying some of the "A" cells as "B" or higher cells. More than two passes are also contemplated, although there will be diminishing returns with increasing number of passes. Further, each pass may have the same demarcation current, or with each successive pass, the demarcation current used converges to that of a breakpoint normally used in a conventional single-pass sensing. Additionally, breakpoints can be used between states E and A, as well as between states B and C.

In general, there will be a page of memory cells being operated on by a corresponding number of multi-pass sense blocks 200. A page controller 298 (see FIG. 8) supplies control and timing signals to each of the sense modules. In one embodiment, the page controller 298 is implemented as part of the state machine 122 in the control circuitry 120. In another embodiment, page controller 298 is part of the read/write circuits 130. Page controller 298 cycles each of the multi-pass sense blocks 200 through a predetermined number of passes (j=1 to N) and also supplies a predetermined demarcation current value $I_0(j)$ for each pass. The demarcation current value can also be implemented as a time period for sensing. After the last pass, the page controller 298 enables transfer gate 293 with a signal NCO to read the state of the SEN2 node 294 as sensed data to a readout bus 292. In all, a page of sense data will be read out from all of the sense modules.

As an example, additional operation and timing of the sense module 210 including the sense amplifier of FIG. 8 during read/verify operations will be discussed with respect to the timing diagrams FIGS. 15(A)–15(K), which are demarcated into PHASES (1)–(9).

Phase (0): Setup

The sense module 210 is connected to the bit line 285 via an enabling signal BLS (FIG. 15(A)). The Voltage clamp is enabled with BLC (FIG. 15(B)). The Precharge circuit 240 is enabled as a limited-current source with a control signal FLT (FIG. 15(C)).

Phase (1): Controlled Precharge

Sense amplifier 230 is initialized by a reset signal RST (FIG. 15(D)) which will pull the signal INV to ground via the transistor 258. Thus, on reset, INV is set to LOW. At the same time, a p-transistor 363 pulls a complementary signal LAT to $V_{dd}$ or HIGH (FIG. 15(H)).

Isolation gate 236 is formed by an n-transistor 238, which is controlled by the signal LAT. Thus, after reset, the isolation gate is enabled to connect sense node 294 to the sense amplifier's internal sense node 244, and the signal SEN2 will be the same as the signal SEN at the internal sense node 244.

The precharge circuit 240 precharges the bit line 285 through the internal sense node 244 and the sense node SEN2 294 for a predetermined period of time. This will bring the bit line to an optimal voltage for sensing the conduction therein.

The precharge circuit 240 includes a pull-up p-transistor 242 controlled by the control signal FLT ("FLOAT"). The bit line will be pulled up towards the desired bit line voltage as set by the bit line voltage clamp 280. The rate of pull-up will depend on the conduction current in the bit line. The smaller the conduction current, the faster the pull-up.

It has been described earlier that sensing errors due to the source line bias are minimized if those memory cells with conduction currents higher than a predetermined value are turned off and their contributions to the source line bias eliminated. Precharge circuit 240 is implemented to serve two functions. One is to precharge the bit line to an optimal sensing voltage. The other is to help identify those memory cells with conduction currents higher than a predetermined value for D.C. (Direct Current) sensing so that they may be eliminated from contributing to source line bias.

The D.C. sensing is accomplished by providing a precharge circuit that behaves like a current source for supplying a predetermined current to the bit line. The signal FLT that controls the p-transistor 242 is such that it "programs" a predetermined current to flow through the precharge circuit 240. As an example, the FLT signal may be generated from a current mirror with a reference current set to 500 nA. When the p-transistor 242 forms the mirrored leg of the current mirror, it will also have the same 500 nA throwing in it.

Figure 15:
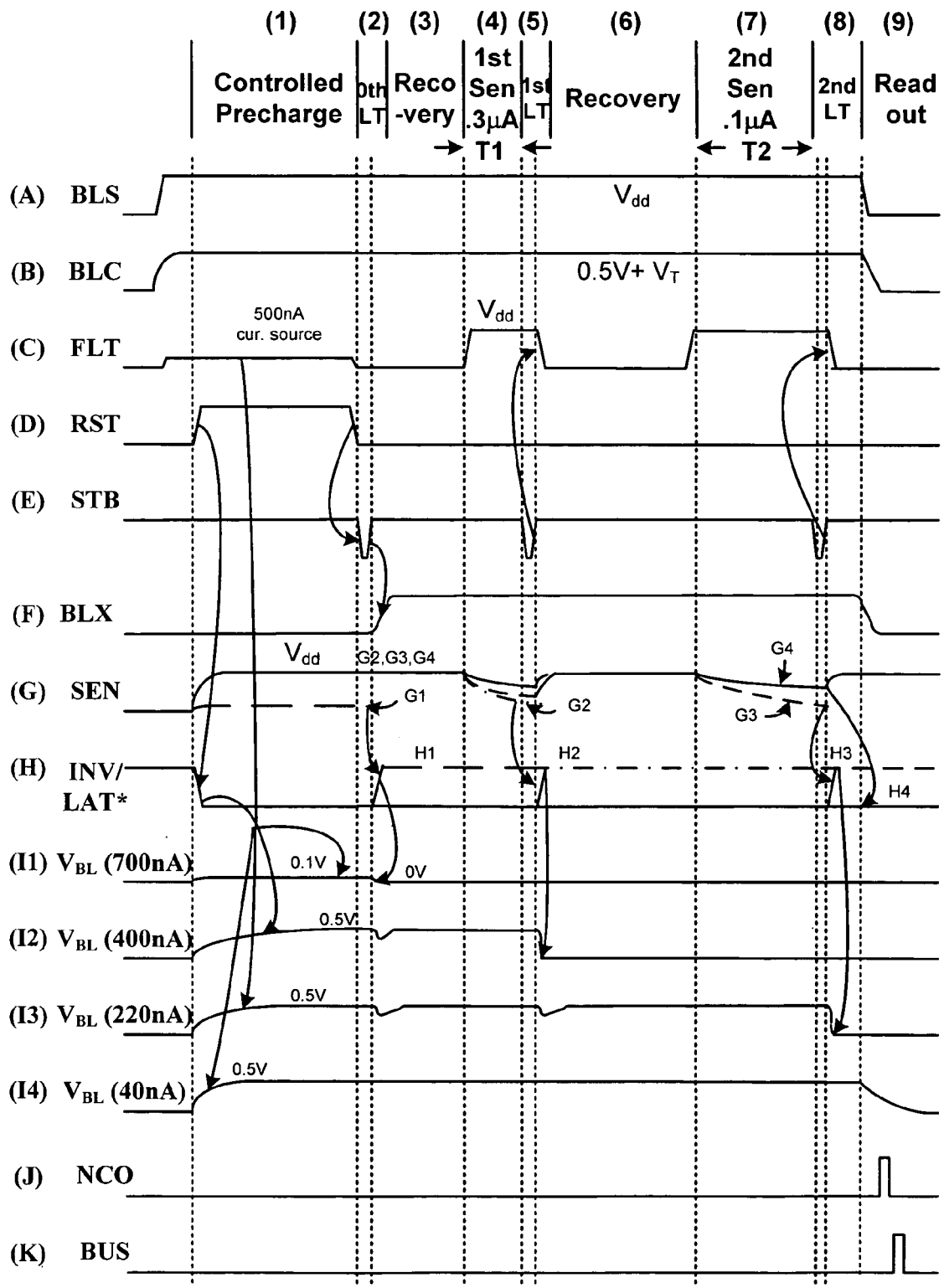
FIG. 15 is a timing diagram explaining a portion of the operation of a sense module.

FIGS. 15(I1)–15(I4) illustrate the voltages on four example bit lines connected respectively to memory cells with conduction currents of 700 nA, 400 nA, 220 nA and 40 nA. When the precharge circuit 240 is a current source with a limit of 500 nA, for example, a memory cell having a conduction current exceeding 500 nA will have the charges on the bit line drained faster than it can accumulate. Consequently, for the bit line with conduction current 700 nA, its voltage or the signal SEN at the internal sense node 244 will remain close to 0V (such as 0.1 volt; see FIG. 15(I1)). On the other hand, if the memory cell's conduction current is below 500 nA, the precharge circuit 240 will begin to charge up the bit line and its voltage will begin to rise towards the clamped bit line voltage (e.g., 0.5V set by the voltage clamp 280) (FIGS. 15(I2)–15(I4)). Correspondingly, the internal sense node 244 will either remain close to 0V or be pulled up to $V_{dd}$ (FIG. 15(G)). Generally, the smaller the conduction current, the faster the bit line voltage will charge up to the clamped bit line voltage. Thus, by examining the voltage on a bit line after the controlled precharge phase, it is possible to identify if the connected memory cell has a conduction current higher or lower than a predetermined level.

Phase (2): D.C. Latching & Removing the High Current Cells from Subsequent Strobes After the controlled precharge phase, an initial D.C. high-current sensing phase begins where the signal SEN is sensed by the discriminator circuit 250. The sensing identifies those memory cells with conduction currents higher than the predetermined level. The discriminator circuit 250 includes two p-transistors 254 and 256 in series, which serve as a pull up for a node 257 registering the signal INV. The p-transistor 254 is enabled by a read strobe signal STB going LOW and the p-transistor 256 is enabled by the SEN signal at the internal sense node 244 going LOW. High current memory cells will have the signal SEN close to 0V or at least unable for its bit lines to be precharged sufficiently high to turn off the p-transistor 256. For example, if the weak pull up is limited to a current of 500 nA, it will fail to pull up a cell with conduction current of 700 nA (FIG. 15(G1)). When STB strobes LOW to latch, INV at the node 257 is pulled up to $V_{dd}$. This will set the latch circuit 214 with INV HIGH and LAT LOW (FIG. 15(H1)).

When INV is HIGH and LAT LOW, the isolation gate 236 is disabled and the sense node 294 is blocked from the internal sense node 244. At the same time, the bit line is pulled to ground by the pull down circuit 290 (FIG. 15(I1)). This will effectively turn off any conduction current in the bit line, eliminating it from contributing to source line bias.

Thus, in one preferred implementation of the sense module 210, a limited-current source precharge circuit is employed. This provides an additional or alternative way (D.C. sensing) to identify bit lines carrying high currents and to turn them off to minimize source line bias error in subsequent sensing.

In another embodiment, the precharge circuit is not specifically configured to help identify high current bit lines but is optimized to pull up and precharge the bit line as fast as possible within the allowance of the maximum current available to the memory system.

Phase (3): Recovery/Precharge

Prior to a sensing of the conduction current in a bit line that has not been previously pulled down, the precharge circuit is activated by the signal FLT going LOW to precharge the internal sense node 244 to $V_{dd}$ (FIG. 15(C) and FIGS. 15(I2)–15(I4)) and the bit line which may have been partially discharged due to a decrease in the voltage on adjacent bit lines.

Phase (4): First A.C. Sensing

In one embodiment, an A.C. (Alternating Current or transient) sensing is performed by determining the voltage drop at the floated internal sense node 244. This is accomplished by the discriminator or compare circuit 250 employing the capacitor $C_{SA}$ 252 coupled to the internal sense node 244, and considering the rate the conduction current is charging it (reducing the voltage on node SEN). In an integrated circuit environment, the capacitor 252 is typically implemented with a transistor; however, other implementations are suitable. Capacitor 252 has a predetermined capacitance, e.g., 30 fF, which can be selected for optimal current determination. The demarcation current value, typically in the range of 100–1000 nA, can be set by appropriate adjustment of the charging period.

The discriminator circuit 250 senses the signal SEN in the internal sense node 244. Prior to each sensing, the signal SEN at the internal sense node 244 is pulled up to $V_{dd}$ by the precharge circuit 240. This will initially set the voltage across the capacitor 252 to be zero.

When the sense amplifier 230 is ready to sense, the precharge circuit 240 is disabled by FLT going HIGH (FIG. 15(C)). The first sensing period T1 is ended by the assertion of the strobe signal STB. During the sensing period, a conduction current induced by a conducting memory cell will charge the capacitor. The voltage at SEN will decrease from $V_{dd}$ as the capacitor 252 is charged through the draining action of the conduction current in the bit line. FIG. 15(G) (see curves G2–G4) illustrates the SEN signal corresponding to the remaining three example bit lines connected respectively to memory cells with conduction currents of 400 nA, 220 nA and 40 nA, the decrease being more rapid for those with a higher conduction current.

Phase (5): First A.C. Latching and Removal of Higher Current Cells from Subsequent Sensing At the end of the first predetermined sensing period, SEN will have decreased to some voltage depending on the conduction current in the bit line (see curves G2–G4 of FIG. 15G). As an example, the demarcation current in this first phase is set to be at 300 nA. The capacitor $C_{SA}$ 252, the sensing period T1 and the threshold voltage of the p-transistor 256 are such that the signal SEN corresponding to a conduction current higher than the demarcation current (e.g., 300 nA) will drop sufficiently low to turn on the transistor 256 in the discriminator circuit 250. When latching signal STB strobes LOW, the output signal INV will be pulled HIGH, and will be latched by the latch 214 (FIG. 15(E) and FIG. 15(H) (curve H2)). On the other hand, the signal SEN corresponding to a conduction current below the demarcation current will produce a signal SEN unable to turn on the transistor 256. In this case, the latch 660 will remain unchanged, in which case LAT remains HIGH (FIGS. 15(H3) and 15(H4)). Thus, it can be seen that the discriminator circuit 250 effectively determines the magnitude of the conduction current in the bit line relative to a reference current set by the sensing period.

Sense amplifier 230 also includes the second voltage clamp 232 whose purpose is to maintain the voltage of the drain of the transistor 234 sufficiently high in order for the bit line voltage clamp 280 to function properly. As described earlier, the bit line voltage clamp 280 clamps the bit line voltage to a predetermined value $V_{BL}$, e.g., 0.5V. This will require the gate voltage BLC of the transistor 234 to be set at $V_{BL}+V_T$ (where $V_T$ is the threshold voltage of the transistor 234) and the drain connected to the sense node 294 to be greater than the source, i.e., the signal SEN2>$V_{BL}$. In particular, given the configurations of the voltage clamps 280 and 232, SEN2 should be no higher than the smaller of LAT–$V_T$ or BLX–$V_T$, and SEN should be no lower. During sensing, the isolation gate 236 is in a pass-through mode. However, during sensing the signal SEN at the internal sense node 244 has a voltage that decreases from $V_{dd}$. The second voltage clamp 232 prevents SEN from dropping below LAT–$V_T$ or BLX–$V_T$, whichever is lower. This is accomplished by an n-transistor 234 controlled by a signal BLX, where BLX is $\geq V_{BL}+V_T$ (FIG. 15(F)). Thus, through the actions of the voltage clamps 280 and 232, the bit line voltage $V_{BL}$ is kept constant, e.g., ~0.5V, during sensing.

Measuring current using a dedicated capacitor 252 instead of traditional use of the bit line capacitance is advantageous in several respects. First, it allows a constant voltage source on the bit line thereby avoiding bit-line to bit-line crosstalk. Secondly, the dedicated capacitor 252 allows a capacitance to be selected that is optimal for sensing. For example, it may have a capacitance of about 30 fF as compared to a bit line capacitance of about 2 pF. A smaller capacitance can increase the sensing speed since it charges faster. Finally, sensing relative to a dedicated capacitance as compared to the prior art method of using the capacitance of the bit line allows the sensing circuits to be independent of the memory architecture or size.

In another embodiment, the current determination is accomplished by comparison with a reference current, which may be provided by the conduction current of a reference memory cell. This could be implemented with the compare current as part of a current mirror.

The output of the current determination is latched by the latch circuit 214. The latch circuit is formed as a Set/Reset latch by the transistors 261, 262, 263 and 264 together with the transistors 260 and 268. The p-transistor 260 is controlled by the signal RST (RESET) and the n-transistor 268 is controlled by the signal STB. A variation of the above-described sense amplifier that is adapted for low voltage operation is found in U.S. patent application Ser. No. 11/015,199 titled "Improved Memory Sensing Circuit And Method For Low Voltage Operation," Inventor Raul-Adrian Cernea, filed on Dec. 16, 2004, incorporated herein by reference in its entirety.

In general, there will be a page of memory cells being operated on by a corresponding number of multi-pass sense modules 210. For those memory cells having conduction current higher than the first demarcation current level, their LAT signal will be latched LOW (UV latched HIGH). This in turn activates the bit line pull down circuit 290 to pull the corresponding bit lines to ground, thereby turning off their currents.

Phase (6): Recovery/Precharge

Prior to the next sensing of the conduction current in a bit line such as bit line 285 that has not been previously pulled down, the precharge circuit is activated by the signal FLT to precharge the internal sense node 244 to $V_{dd}$ (FIG. 15(C)(6) and FIGS. 15(I3)(6)–15(I4)(6)).

Phase (7): Second Sensing

When the sense amplifier 230 is ready to sense, the precharge circuit 240 is disabled by FLT going HIGH (FIG. 15(C)). The second sensing period T2 is set by the assertion of the strobe signal STB. During the sensing period, a conduction current, if any, will charge the capacitor. SEN will decrease from $V_{dd}$ as the capacitor 252 is charging through the draining action of the conduction current in the bit line 285.

In accordance with the example before, the memory cells with conduction currents higher than 300 nA have already been identified and shut down in the earlier phases. FIG. 15(G) (curves G3 and G4) illustrate respectively the SEN signal corresponding to the two example bit lines connected respectively to memory cells with conduction currents of 220 nA and 40 nA.

Phase (8): Second Latching for Reading Out

At the end of the second predetermined sensing period T2, SEN will have decreased to some voltage depending on the conduction current in the bit line 285 (FIG. 15(G) (curves G3 and G4)). As an example, the demarcation current in this second phase is set to be at 100 nA. In this case, the memory cell with the conduction current 220 nA will have its INV latched HIGH (FIG. 15(H)) and its bit line subsequently pulled to ground (FIG. 15(I3)). On the other hand, the memory cell with the conduction current 40 nA will have no effect on the state of the latch, which was preset with LAT HIGH.

Phase (9): Read Out to the Bus

Finally, in the read out phase, the control signal NCO at the transfer gate 293 allows the latched signal SEN2 to be read out to the readout bus 292 (FIGS. 15(J) and 15(K)).

As can be seen from FIGS. 15(I1)–15(I4), the bit line voltage remains constant during each sensing period. Thus, from the discussion earlier, capacitive bit-line to bit-line coupling is eliminated.

The sense module 210 described above is one embodiment where sensing is performed with three passes, the first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes, some using only two or more A.C. passes, or only one pass. For the different passes, the demarcation current value used may be the same each time or converge progressively towards the demarcation current used in the final pass.

Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming.

Figure 16:
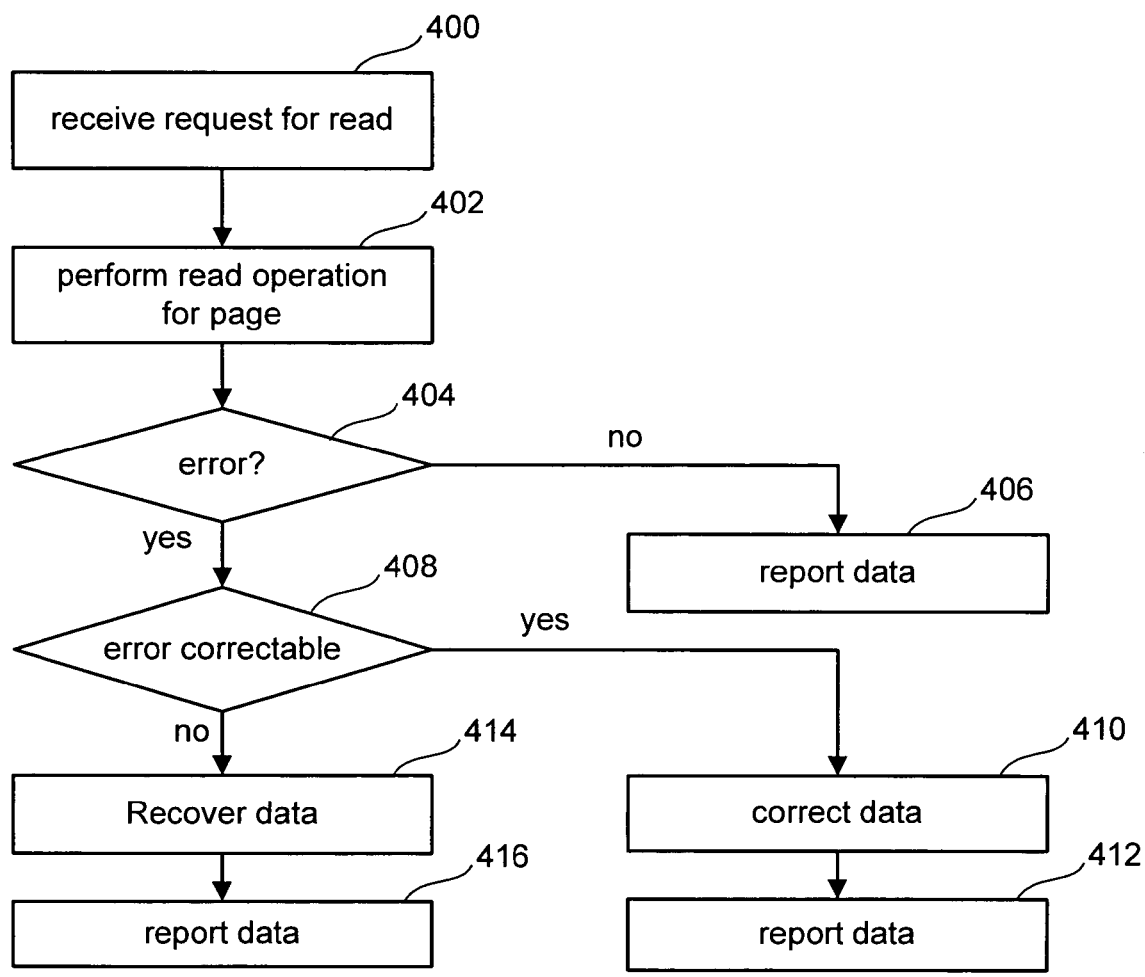
FIG. 16 is a flow chart describing one embodiment of a process for reading non-volatile memory.

FIG. 16 is a flow chart describing one embodiment for reading data from non-volatile memory cells. The discussion above with respect to the sense modules discusses how data is read from particular bit lines. FIG. 16 provides the read process at the system level. At step 402, a read operation is performed for a particular page in response to a request to read data (step 400). In one embodiment, when data for a page is programmed, the system will also create Error Correction Codes (ECCs) and write those ECCs with the page of data. ECC technologies are well known in the art. The ECC process used can include any suitable ECC process known in the art. When reading data from a page, the ECCs will be used to determine whether there are any errors in the data (step 404). If there are no errors in the data, the data is reported to the user at step 406. For example, data will be communicated to a controller or host via data I/O lines 132. If an error is found at step 404, it is determined whether the error is correctable (step 408). The error may be due to the floating gate to floating gate coupling effect or possibly to other physical mechanisms. Various ECC methods have the ability to correct a predetermined number of errors in a set of data. If the ECC process can correct the data, then the ECC process is used to correct that data in step 410 and the data, as corrected, is reported to the user in step 412. If the data is not correctable by the ECC process, a data recovery process is performed in step 414. In some embodiments, an ECC process will be performed after step 414. More details about the data recovery process are described below. After the data is recovered, that data is reported at step 416. Note that the process of FIG. 16 can be used with data programmed using all bit line programming or odd/even bit line programming.

Figure 17:
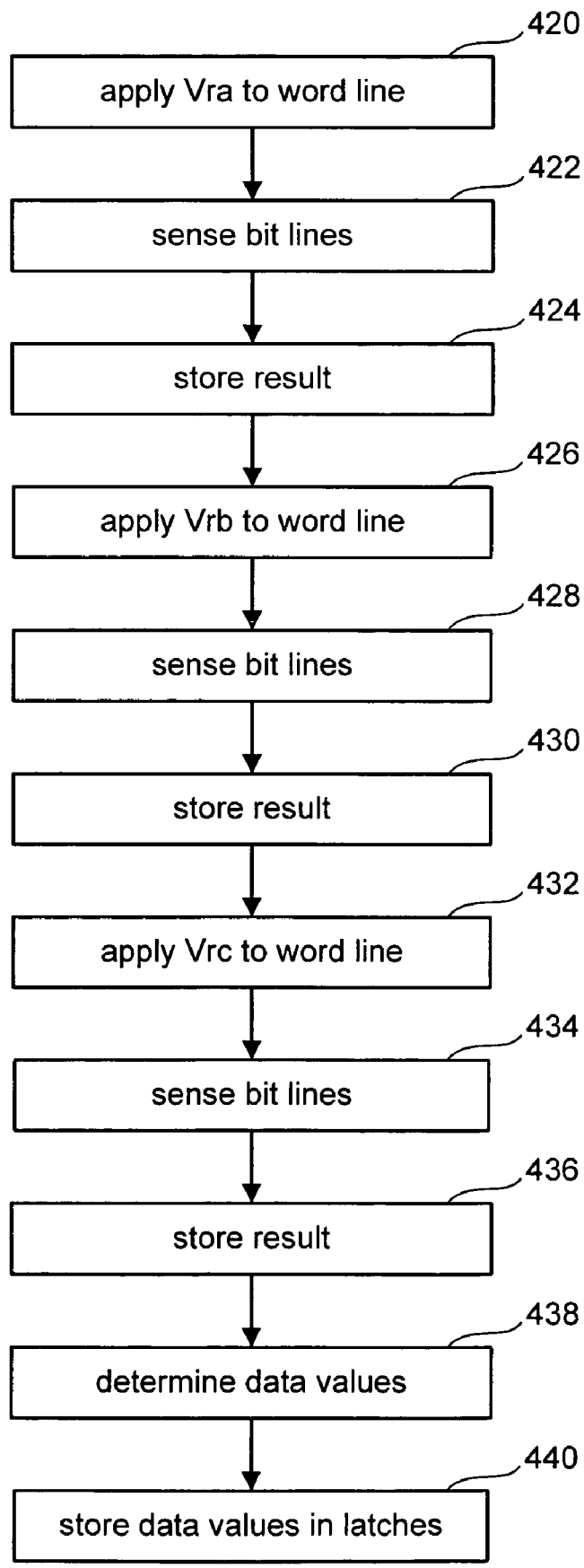
FIG. 17 is a flow chart describing one embodiment of a process for reading a page of data from non-volatile memory.

FIG. 17 is a flow chart describing one embodiment of a process for performing a read operation for a page (see step 402 of FIG. 16). The process of FIG. 17 can be performed for a page that encompasses all bit lines of a block, only odd bit lines of a block, only even bit lines of a block, or other subsets of bit lines of a block. In step 420, read reference voltage Vra is applied to the appropriate word line associated with the page. In step 422, the bit lines associated with the page are sensed to determine whether the addressed memory cells conduct or do not conduct based on the application of Vra to their control gates. Bit lines that conduct indicate that the memory cells were turned on; therefore, the threshold voltages of those memory cells are below Vra (e.g., in state E). In step 424 the result of the sensing for the bit lines is stored in the appropriate latches for those bit lines. In step 426, read reference voltage Vrb is applied to the word lines associated with the page being read. In step 428, the bit lines are sensed as described above. In step 430, the results are stored in the appropriate latches for the bit lines. In step 432, read reference voltage Vrc is applied to the word lines associated with the page. In step 434, the bit lines are sensed to determine which memory cells conduct, as described above. In step 436, the results from the sensing step are stored in the appropriate latches for the bit lines. In step 838, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 222. In step 440, processor 222 will store the determined data values in the appropriate latches for each bit line. In other embodiments, sensing the various levels (Vra, Vrb, and Vrc) may occur in different orders.

Different number of reference read voltages may need to be applied in various embodiments based on the coding and/or architecture employed. For example, when an upper page/lower page architecture is employed and a coding scheme as illustrated in FIG. 12 used, an upper page read may be accomplished simply by using the Vrb read reference voltage level to determine whether a memory cell is in one of states E and A (upper page bit=1) or in one of states B and C (upper page bit=0). A lower page read may be accomplished by using the Vra and Vrc read reference voltage levels to determine whether a memory cell is in one of states E and C (lower page bit=1) or one of states A and B (lower page bit=0). In an example using an upper page lower page architecture and a coding scheme as depicted in FIGS. 13A–13C, a lower page read may be accomplished by using the Vrb read reference voltage level to determine whether a memory cell is in one of states E and A (lower page bit=1) or in one of states B and C (lower page bit=0). An upper page read for such an embodiment may be accomplished using the Vra and Vrc read reference voltages.

Floating gate to floating gate coupling can cause unrecoverable errors during read operations (step 404) which may necessitate the performance of the error recovery step at step 414. The apparent charge stored on the floating gate of a memory cell can undergo an apparent shift because of coupling from an electric field resulting from charge stored on a neighboring memory cell's floating gate. This phenomenon is often referred to as floating gate to floating gate coupling or more simply, just floating gate coupling. While in theory the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and thus, across from each other in a diagonal direction. The apparent shift in charge can result in errors when reading the programmed memory state of a memory cell.

The effects of floating gate coupling are most pronounced in situations where a memory cell adjacent a target memory cell is programmed subsequent to the target memory cell (e.g., in an odd/even bit line architecture), however its effects can be seen in other situations as well. The charge placed on the floating gage of the adjacent memory cell, or a portion of the charge, will couple to the target memory cell resulting in an apparent shift of the threshold voltage of the target memory cell. This change in the apparent threshold voltage of the memory cell can result in a read error when subsequently reading the target memory cell. For example, a memory cell can have its apparent threshold voltage shifted to such a degree after being programmed that it will not turn on or not turn on to a sufficient degree under the applied reference read voltage for the memory state to which it was programmed.

Figure 18A:
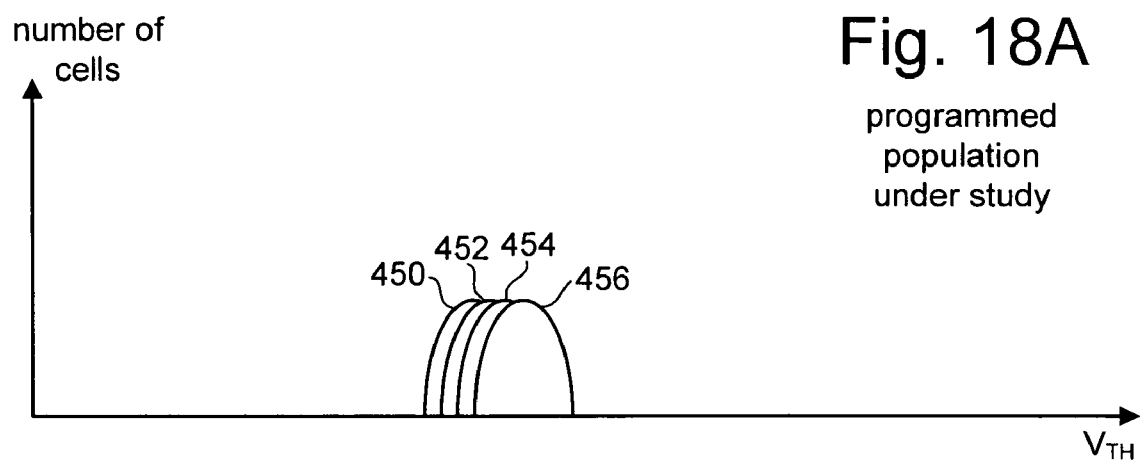
FIGS. 18A–18B depict the shift in apparent charge stored on the floating gates of an exemplary population of memory cells because of coupling of an electric field based on the charge stored in adjacent floating gates.
Figure 18B:
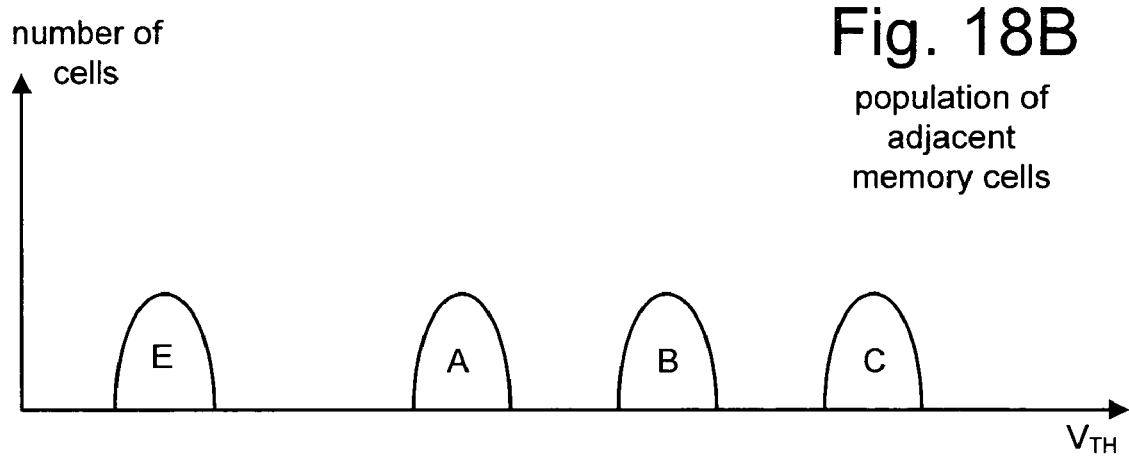

FIGS. 18A–18B illustrate the effects of floating gate coupling on a programmed population of memory cells. In FIG. 18A, the actual threshold voltage distribution 450 of a group of memory cells programmed to state A is depicted. If the cells neighboring the programmed population depicted in FIG. 18A are in erased state E (FIG. 18B), the apparent threshold distribution of the programmed population of memory cells is the same as the actual threshold voltage distribution. The neighboring floating gates are not carrying a positive charge and thus, do not cause a shift in the apparent threshold voltage for the memory cells of distribution 450. If the neighboring memory cells are in programmed state A, however, an electric field will result from the positive charge on their floating gates. A portion of this field will couple to the memory cells of distribution 450 and cause the apparent threshold voltages of those cells to increase. Because of the apparent increase in the memory cells' threshold voltages, distribution 450 is shifted to the right, resulting in apparent threshold voltage distribution 452. As the neighboring memory cells are programmed to higher state levels, more charge is stored on their floating gates which causes the apparent threshold voltage of the population under study to increase further. Distribution 454 represents the apparent threshold voltage distribution of the programmed population if the neighboring memory cells are programmed to state B and distribution 456 represents the apparent threshold voltage distribution if the neighboring memory cells are programmed to state C.

Figure 19A:
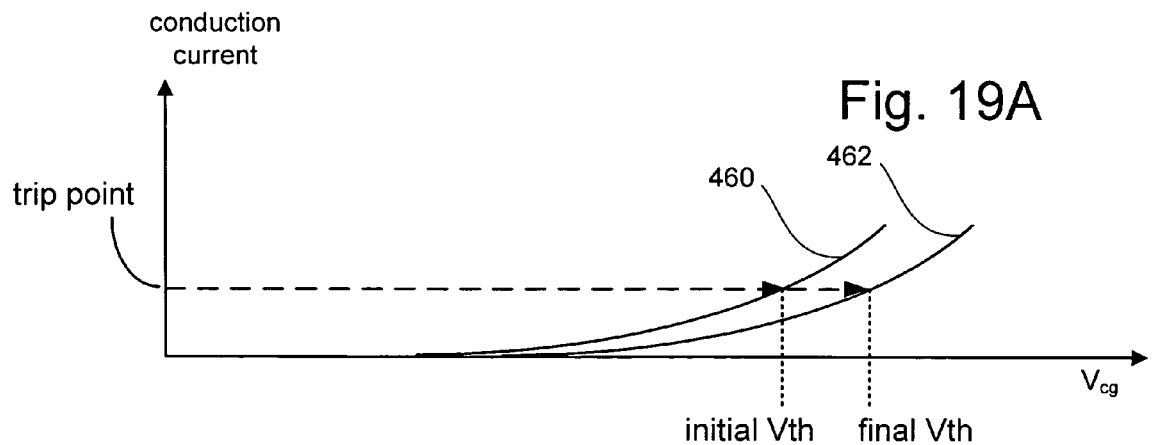
FIGS. 19A–19B depict the effect on the conduction current of an exemplary memory cell because of coupling of an electric field based on the charge stored in adjacent floating gates.

FIG. 19A depicts the effect of floating gate coupling from neighboring memory cells on the conduction current sensed for a selected memory cell during a read operation. As described with respect to FIG. 17, read operations can include the application of a reference read voltage to the control gate of a selected memory cell and then sensing the resulting conduction current to determine whether the threshold voltage of the selected memory cell is above or below the level of the applied reference read voltage. Curve 460 depicts the normal conduction current of an exemplary memory cell programmed to state A as a function of the applied control gate voltage. State A is chosen for exemplary purposes only. One of ordinary skill in the art will appreciate that cells programmed to other states will have different values, but similar I–V curves, and that the following disclosure can be extended to such other states.

A conduction current trip point for a selected state can be established that corresponds to a minimum conduction current that should result from an applied reference read voltage for that state. For example, a trip point current (also referred to as a breakpoint current or level) and reference read voltage combination can be established for a cell programmed to state A such that if the cell is programmed to state A and the reference read voltage is applied, a conduction current greater than or equal to the trip point current should result. As shown in FIG. 19A, if a read voltage (e.g., Vrb) equal to or greater than initial Vth is applied to the memory cell represented by curve 460, it will turn on and have a conduction current greater than or equal to the established trip point current. In one embodiment for a memory array, initial Vth for a particular memory state can be equal to the maximum threshold voltage (e.g., VmaxA as shown in FIG. 11) expected of any memory cell in that state. By applying a Vrb read voltage equal to initial Vth (or equal to initial Vth plus some margin as illustrated in FIG. 11) and sensing the conduction current, it can be determined if the selected memory cell is in one of states E and A or in one of states B and C. If the resulting conduction current that is sensed for the memory cell is above the trip point (cell turned on), it is determined that the memory cell is in either in state E or A. If the resulting current is below the trip point (cell turned off), it is determined that the memory cell is either in state B or C.

Curve 462 depicts the conduction current of the same memory cell represented by curve 460 if one or more neighboring memory cells are programmed. The positive charge on the neighboring floating gate(s) causes an apparent positive increase in the threshold voltage of the selected cell (and a corresponding reduction in conduction current), and thus, the curve is shifted to the right. If a control gate voltage equal to initial Vth is applied to the selected memory cell now, a conduction current less than the trip point current will result. This can cause a read error. A cell programmed to state A may not sufficiently conduct under the applied Vrb read voltage and thus, be falsely read as in a state above state A. For the conduction current to be at or above the trip point, a control gate voltage equal to or greater than the final Vth must be applied to the memory cell.

One technique for compensating for the apparent increase in threshold voltage in order to avoid read errors is to apply a larger control gate voltage during read operations based on the state of one or more neighboring memory cells. U.S. patent application Ser. No. 11\099,133, entitled "COMPENSATING FOR COUPLING DURING READ OPERATIONS OF NON-VOLATILE MEMORY," filed Apr. 5, 2005 describes various such processes. For example, if one or more memory cells neighboring a selected memory cell are programmed, a larger reference read voltage can be applied. For example, the value of a Vrb read voltage can be increased by the difference in the final Vth and initial Vth values to ensure that the memory cells' conduction current is at or above the trip point.

Figure 19B:
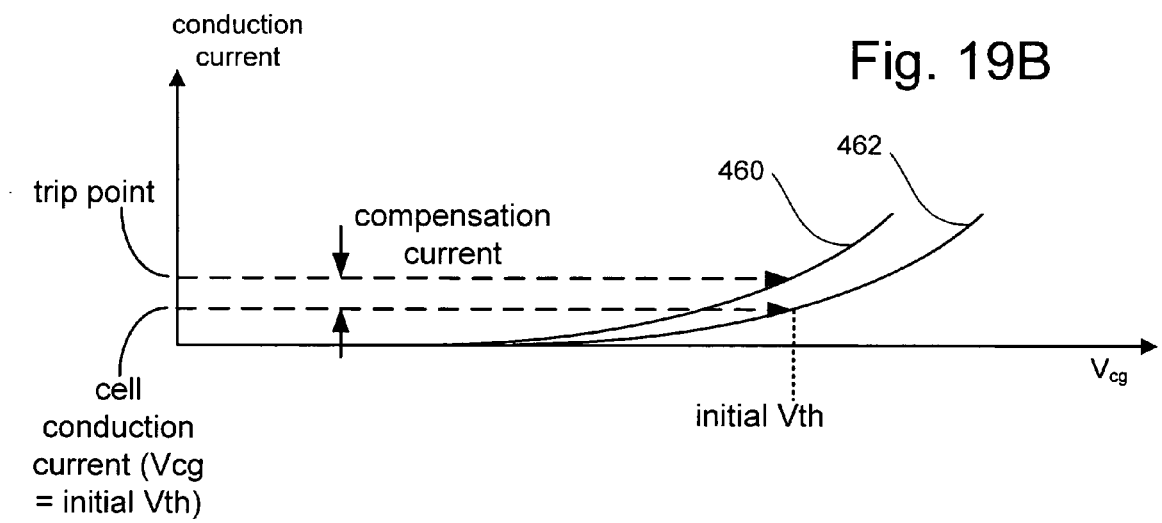

In accordance with embodiments of the present disclosure, however, a compensation current is utilized during read operations to avoid read errors caused by floating gate coupling. FIG. 19B graphically illustrates a method in accordance with one embodiment for applying a compensation current to a selected memory cell's bit line in order to accurately determine the state of the memory cell during read operations when one or more of its neighboring memory cells are in a programmed state and carrying a positive charge at their floating gate. Curve 462 is depicted again in FIG. 19B, representing a memory cell programmed to state A and having one or more neighboring memory cells that were subsequently programmed. The resulting conduction current if a control gate voltage equal to initial Vth is applied to the selected memory cell is shown. For example, if a read voltage Vb equal to initial Vth is applied to the memory cell during an upper page read, the selected memory cell's conduction current will be at some level below the trip point. Rather than increasing the applied control gate voltage during a read operation, a compensation current substantially equal to the difference between the two current levels can be applied. If a compensation current of this magnitude can be added to the bit line of the selected memory cell during a read operation, the sensed conduction current under the originally established Vrb read level will be equal to the actual conduction current of the memory cell plus the compensation current. For example, when using a sensing technique that employs a dedicated capacitor to determine the rate at which the conduction current charges the capacitor, both the compensation current and the cell conduction current will contribute to charging that capacitor (and consequently, the decrease in voltage at the sense node). Thus, the sensed current (actual conduction current plus the compensation current) will be at or above the trip point current. Accordingly, an accurate read operation can be performed even when one or more neighboring memory cells are programmed.

Figure 20:
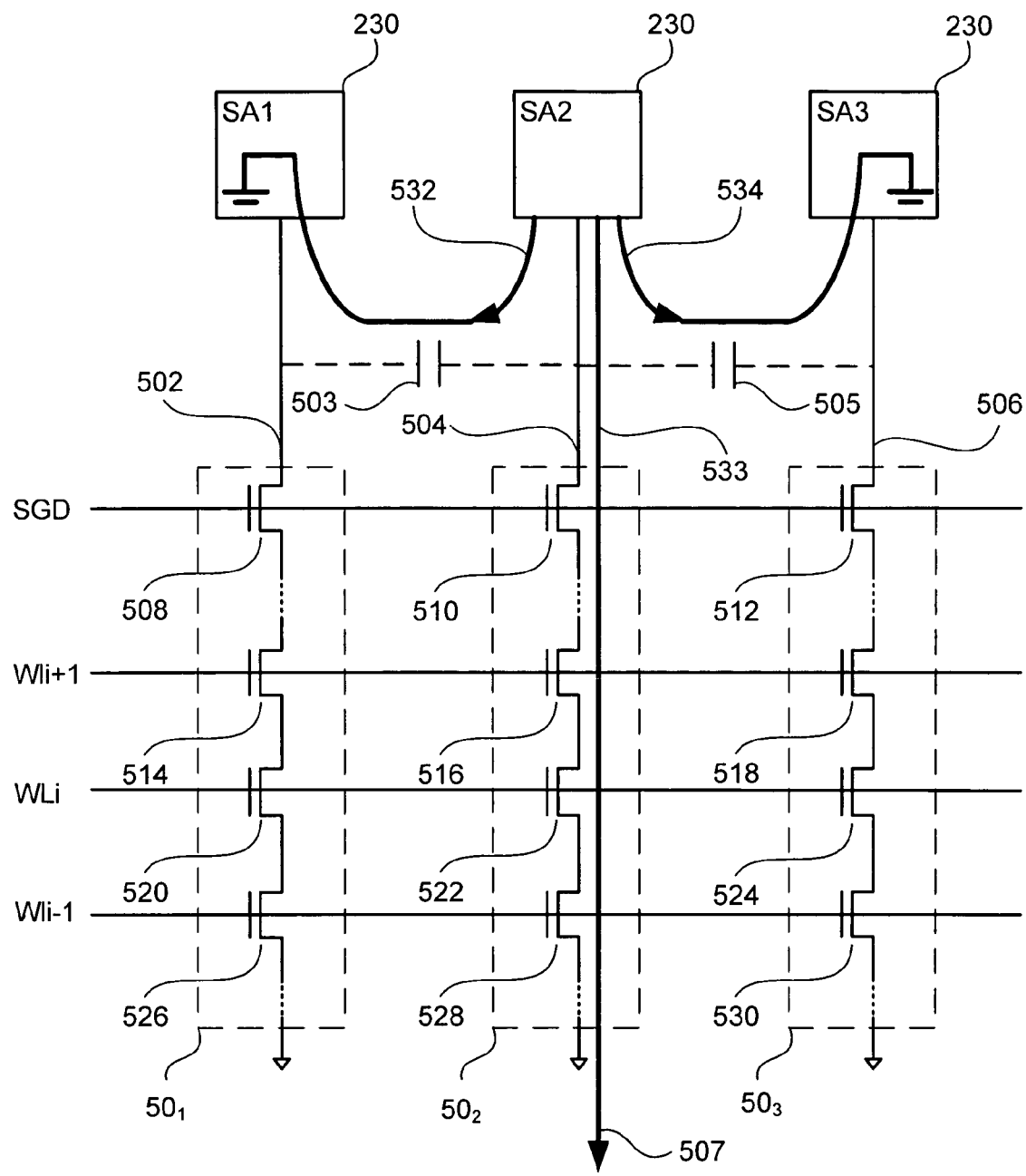
FIG. 20 is a simplified circuit diagram of a memory system depicting compensation currents in accordance with one embodiment.

Various means for inducing currents in neighboring bit lines to provide compensation current(s) for a selected NAND string can be used in accordance with various embodiments. FIG. 20 graphically depicts the use of compensation currents while reading memory cells of a selected bit line in accordance with one embodiment. FIG. 20 is a simplified depiction of a memory device including three sense amplifiers SA1, SA2, and SA3. Sense amplifier SA1 is coupled to NAND string $50_1$ through bit line 502. Sense amplifier SA2 is coupled to NAND string $50_2$ through bit line 504. Sense amplifier SA3 is coupled to NAND string $50_3$ through bit line 506. The depiction of each NAND string is simplified and only illustrates the drain select gates 508, 510, and 512 for one NAND string on each bit line and exemplary memory cells connected to word lines WLi, WLi−1 and WLi+1.

In accordance with one embodiment, a compensation current for use while reading a memory cell of a selected NAND string can be generated by exploiting the capacitive coupling between neighboring bit lines to induce a current flow in the selected bit line. Because of the closely spaced arrangement of neighboring bit lines, a relatively strong capacitance exists between them. In FIG. 20, this effect is depicted by capacitor 503, representing the capacitance between bit line 504 and bit line 502, and capacitor 505, representing the capacitance between bit line 506 and bit line 504. Owing to this bit line capacitance, a relatively strong coupling between neighboring bit lines exists. By creating a change in the voltage potential between two neighboring bit lines, a transient current flow can be made to flow such as current flow 532 and 534. The current(s) in the bit line of the selected NAND string can be used as a compensation current(s) during read operations.

This change in potential between neighboring bit lines can be created by providing an initialization voltage to the bit line of a neighboring memory cell determined to be in a programmed state. The bit line of the selected NAND string being read will be maintained (or attempted to be maintained) at the controlled precharge level during the sensing operation as previously described with respect to FIG. 15. If the initialization voltage provided to the neighboring bit line(s) is less than that of the controlled level, a transient current will flow from the selected bit line to the neighboring bit line. In the embodiment of FIG. 20, the initialization voltage is ground as depicted in sense amplifiers SA1 and SA3. In other embodiments, other initialization voltages can be used to result in varying amounts of compensation current. Bit lines 502 and 506 can be grounded by raising the INV signal which will activate the pull down circuit 290 of each sense amplifier SA1 and SA3.

Consider a read operation for memory cell 522 of NAND string $50_2$ which is connected to word line WLi. If either of the memory cells of NAND strings $50_1$ and $50_3$ that are connected to word line WLi are in one of a selected set of programmed states and thus, carrying a positive threshold at their floating gates, a compensation current can be provided when reading cell 522 to improve the accuracy of the read operation. Individual compensation currents can be induced between the selected bit line and each of the neighboring bit lines as diagrammatically illustrated by currents 532 and 534. If memory cell 520 of NAND string $50_1$ is programmed, compensation current 532 can be generated to compensate for the reduced amount of conduction current 507 that will flow through NAND string $50_2$ as a result of an apparent increase in the threshold voltage of memory cell 522 resulting from floating gate coupling of the charge at memory cell 520. Likewise, if memory cell 524 is programmed, compensation current 534 can be generated to compensate for the reduced amount of conduction current 507 that will flow through NAND string $50_2$ as a result of an apparent increase in the threshold voltage of memory cell 522 resulting from floating gate coupling of the charge at memory cell 524. Sense amplifier SA2 will see an apparent conduction current of memory cell 522 equal to the actual conduction current 507 plus the compensation currents 532 and 534. Compensation currents 532 and 534 will act to increase the rate at which dedicated capacitor 252 of SA2 is charged and the rate at which SEN node 244 discharges.

In further embodiments, the state of other memory cells on neighboring NAND strings can also be used to determine whether to utilize compensation currents. For example, the programmed state of diagonally spaced memory cells such as memory cells 514, 518, 526, and 530 can be used to determine whether to provide a compensation current from bit lines 502 or 506 when reading memory cell 522.

Figure 21:
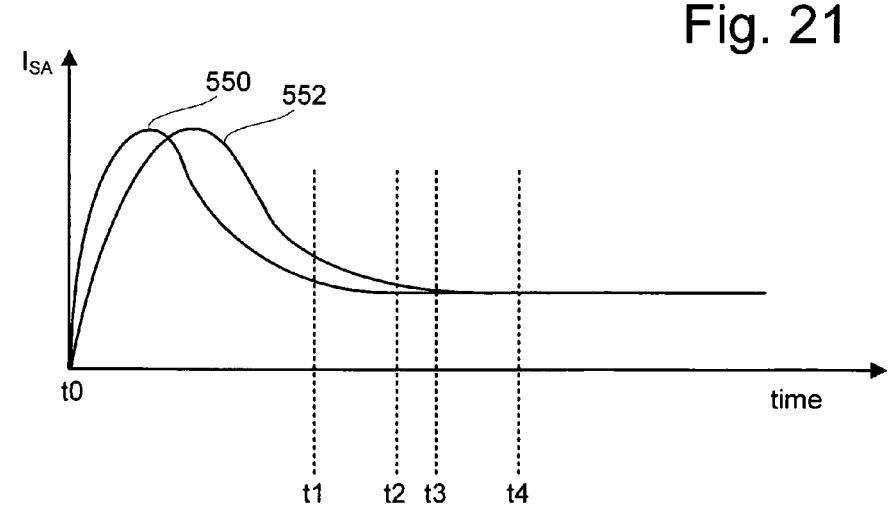
FIG. 21 is a graph depicting the conduction current of an exemplary memory cell as seen by a sense amplifier when a compensation current is used.

FIG. 21 is a graph illustrating an exemplary conduction current supplied by a sense amplifier during a read operation. Curve 550 represents the current behavior of the memory cell as the NAND string is biased for the read operation. Curve 550 ignores the affects of charges or electric fields of neighboring NAND strings. At time t0, the NAND string including the memory cell is initially biased for the read operation. For example, time t0 may represent the beginning of the controlled precharge phase (phase 1) or recovery phases (phases 3 and 6) as described with respect to the read operation described in FIGS. 15A–15K. After applying the initial bias conditions, the current rises and then lowers to its steady state DC level which represents the conduction current of the memory cell under the applied conditions. The increased current above the steady state level is often referred to as a displacement current.

The rise in sensed current above the steady state DC level can be attributed to parasitic capacitance of the selected bit line. The NAND string architecture implemented in closely spaced arrangements can result in a large parasitic capacitance between the bit lines of the device and the ground potential. Because of this parasitic capacitance, applying the read voltage conditions to the NAND string, and particularly precharging the bit line to a predetermined level, will result in a displacement current.

To accurately sense the conduction current of a memory cell, the sensing period is normally delayed until the displacement currents have dissipated and the current through the string has settled to its steady state level. For example, time t3 may be the start of the sensing phase of the read operation. This can correspond to the beginning of phases 4 and 7 in FIGS. 15A–15K during which current sensing is performed. Time t3 can correspond to the time at which the signal FLT goes high and disables the precharge circuit 240. Time t4, can represent the end of the sensing period and the beginning of a latching phase. For example, it may represent the start of phases 5 and 8, at which time the STB signal is strobed low to latch the output signal INV.

Curve 552 also represents the current behavior of the memory cell as the NAND string is biased for the read operation. However, curve 552 includes the affects of one or more adjacent NAND strings on the selected NAND string during the read operation. For example, initializing a neighboring bit line to some voltage below the controlled bit line voltage can be expected to result in a total sensed current by the sense amplifier for the selected NAND string as depicted by curve 552. Due to capacitive coupling when the neighboring bit line is initialized to the low voltage, a current flow is induced between the neighboring bit line and the selected bit line as previously described. This capacitively coupled current will increase the apparent displacement current in the selected bit line. As illustrated, curve 552 takes longer to settle to the DC current level representative of the conduction current of the memory cell. This is due to the additional displacement current resulting form the neighboring bit line(s).

In accordance with one embodiment, this additional displacement current resulting from the capacitively coupled current from the neighboring bit line(s) is used as a compensation current. If one or more neighboring memory cells are in a predetermined programmed state, their corresponding bit lines can be initialized to a low voltage to induce a transient current flow between the selected bit line and the neighboring bit line(s) at the start of a precharge or recovery phase of the read operation. The induced current flow(s) will cause the affect on the selected NAND string sensed current as illustrated by curve 552. In order to utilize this additional current, the time period for sensing the conduction current is adjusted (shorter recovery time) so that the additional displacement current is present in the selected bit line during sensing. Accordingly, time t1 can be used as the start of a sensing phase (e.g., phases 4 and 7) and time t2 can be used as the start of the latching phases (e.g., phases 5 and 8). As illustrated during the time between t1 and t2, the sensed current does not settle to the DC level due to the capacitively coupled current(s). This additional current can compensate for a reduced conduction current through the selected memory cell that results from the apparent increase in the threshold voltage of the selected memory cell due to capacitive charge coupling from the positively charged floating gate of a neighboring memory cell.

Figure 22:
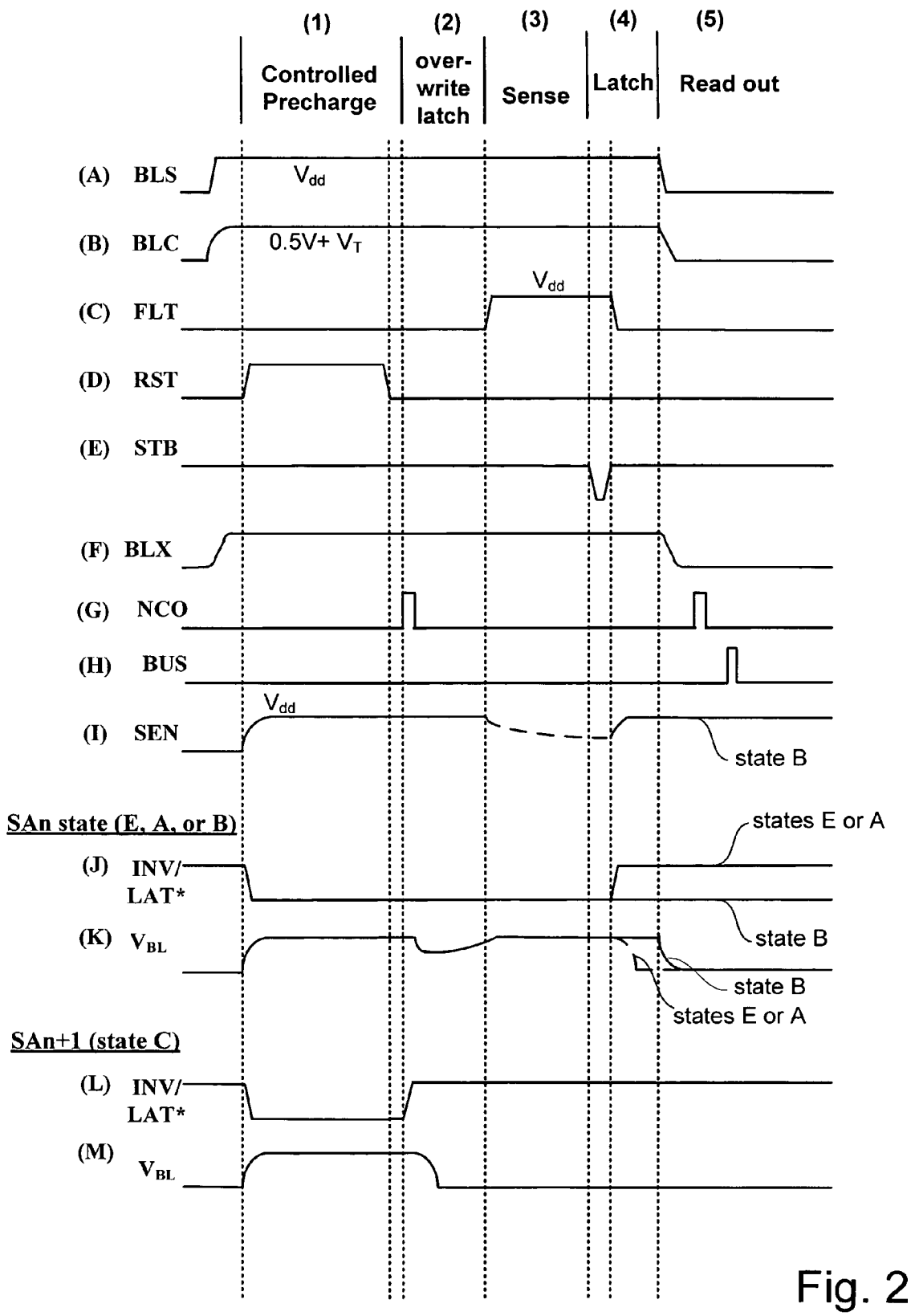
FIG. 22 is a timing diagram of the operation of a sense module while sensing using compensation currents.

FIG. 22 is a timing diagram depicting the various signals and voltage levels involved when sensing using compensation currents. The operation depicted in FIG. 22 is a second read done after determining which adjacent memory cells are in one or more of a predetermined set of programmed states. For example, FIG. 22 could correspond to an upper page read operation performed at the Vrb read level. After determining which memory cells are programmed to state C during a previous read operation, compensation currents can be provided if necessary during the Vrb level read operation depicted in FIG. 22. Signals (A)–(I) are the same for every bit line being sensed during the operation. Signals (L) and (M) correspond to the bit lines of memory cells that were determined to be in state C as a result of the preceding read operation. Signals (J) and (K) correspond to the bit lines of memory cells that were not determined to be in state C as a result of the preceding read operation. The conduction currents of these cells are sensed during the depicted operation to determine whether they are in one of states E and A or in state B. Although FIG. 22 is described with respect to an upper page read at the VrB level after determining which cells are in state C, other types of reads according to the embodied principles can be performed.

Phase (0): Setup

In phase (0), the sense module 380 for each bit line is connected to its corresponding bit line via enabling signal BLS. The voltage clamp is enabled with BLC.

Phase (1): Controlled Precharge

Each sense amplifier 230 is initialized by reset signal RST which pulls the signal INV LOW and complementary signal LAT HIGH (e.g., Vdd). Precharge circuits 240 precharge their corresponding bit lines through internal sense nodes 244 and sense node SEN2 294 for a predetermined period of time. This will bring the bit line to an optimal voltage (e.g., 500 mV) for sensing the conduction therein. As illustrated in FIGS. 22(K) and 22(M), the bit lines of memory cells in state C as well as in one of the other states are raised to the clamped bit line voltage level.

Phase (2): Overwrite Sense Amplifier Latches for Cells in State C

Overwriting the sense amplifier latches for cells in state C results in the bit lines of those memory cells being pulled to ground, and thus creating a difference in potential between those bit lines and their neighboring bit lines having a memory cell not in state C. The act of phase (2) will induce a transient current flow (compensation current) from the sense amplifiers of cells in state E, A, or B to any neighboring sense amplifiers for memory cells in state C as shown in FIG. 20.

For the bit lines of memory cells in state C, the INV signal is driven high. At the same time, the NCO signal for all bit lines is pulsed. As a result, predetermined data is driven back into the sense amplifier latch for the bit lines having memory cells in state C. For example, an indication of whether a memory cell is in state C, as determined in the preceding read operation at the Vrc read level can be maintained in the data latch stack 224 of each bit line. At the beginning of phase (2), this data can be read by processor 222. If the data indicates that the memory cell is in state C, the processor can overwrite the data in corresponding bit line latch 214, thus overwriting the reset of phase (1) and causing INV to go high. This will in turn ground the corresponding bit line by activating pull down circuit 290.

Phase (3): Sensing

After overwriting the bit line latches for memory cells in state C and grounding their bit lines, the sensing phase begins by raising the FLT signal for each sense amplifier. Sensing phase (3) is performed as previously described in FIG. 15. With FLT high, the internal sense nodes 244 become dynamic and the conduction current of a memory cell will charge the dedicated capacitor 252. The voltage at SEN 244 will decrease from Vdd as the capacitor is charged through the draining action of the conduction current in the bit line. FIG. 14(I) is simplified to show just one example of the voltage at SEN node 244 falling. The amount and rate of the decrease in voltage depends upon the state of the corresponding cell. Cells in state E will have the highest conduction current and thus, SEN node 244 will decrease most rapidly for those cells. Cells in state A will have the SEN node 244 of their sense amplifiers decrease at the next highest rate and cells in state B will have their SEN node 244 decrease at the slowest rate. Because of INV going high for cells in state C, their internal SEN nodes 244 are disconnected from the bit lines and thus, no action occurs during the sense phase.

Importantly, the sensing phase is accomplished while compensation currents are flowing from the selected bit lines (cells in state E, A, or B) having one or more neighboring bit lines with a memory cell in state C to those neighboring bit lines. By sensing using a shorter recovery time, the sensed current of the selected bit lines will be equal to the actual conduction current of their respective memory cells plus any compensation currents (transient) resulting from the difference in potential of the selected bit line and neighboring bit line(s) that have been grounded. Looking back at FIG. 21, the start of sensing phase (3) can correspond to time t1 and the start of latching phase (4) can correspond to time t2.

Phase (4): Latching

At the end of the sensing period, SEN will have decreased to some voltage depending on the conduction current in the bit line (and any compensation currents). If the sensed conduction current is above the demarcation current level used for the sensing period, the output signal INV will be pulled high and latched by latch 214 when STB strobes LOW. In our example using the Vrb read reference level, cells in state E or A will have conduction currents above the demarcation current level, and thus, their output signals will be pulled high and latched by latch 214. If the sensed conduction current is below the demarcation current level, the output signal INV will remain LOW and latch 214 will be unchanged when STB strobes LOW. In our example, cells in state B will have conduction currents above the demarcation current level, and thus, their output signals will remain low and latch 214 unchanged.

Phase 5: Read Out to the Bus

In the read out phase, the control signal NCO allows the latched signal SEN2 to be read out to the readout bus 292.

In other embodiments, the sensing can be performed in multiple passes as described in FIG. 15. For example, some combination of D.C. and A.C. sensing passes or multiple A.C. passes can be used. If a multiple pass technique is employed, any or all of the sensing phases can be employed using a reduced recovery time as described. In one embodiment, only the last sensing phase will incorporate the reduced recovery time.

Figure 23:
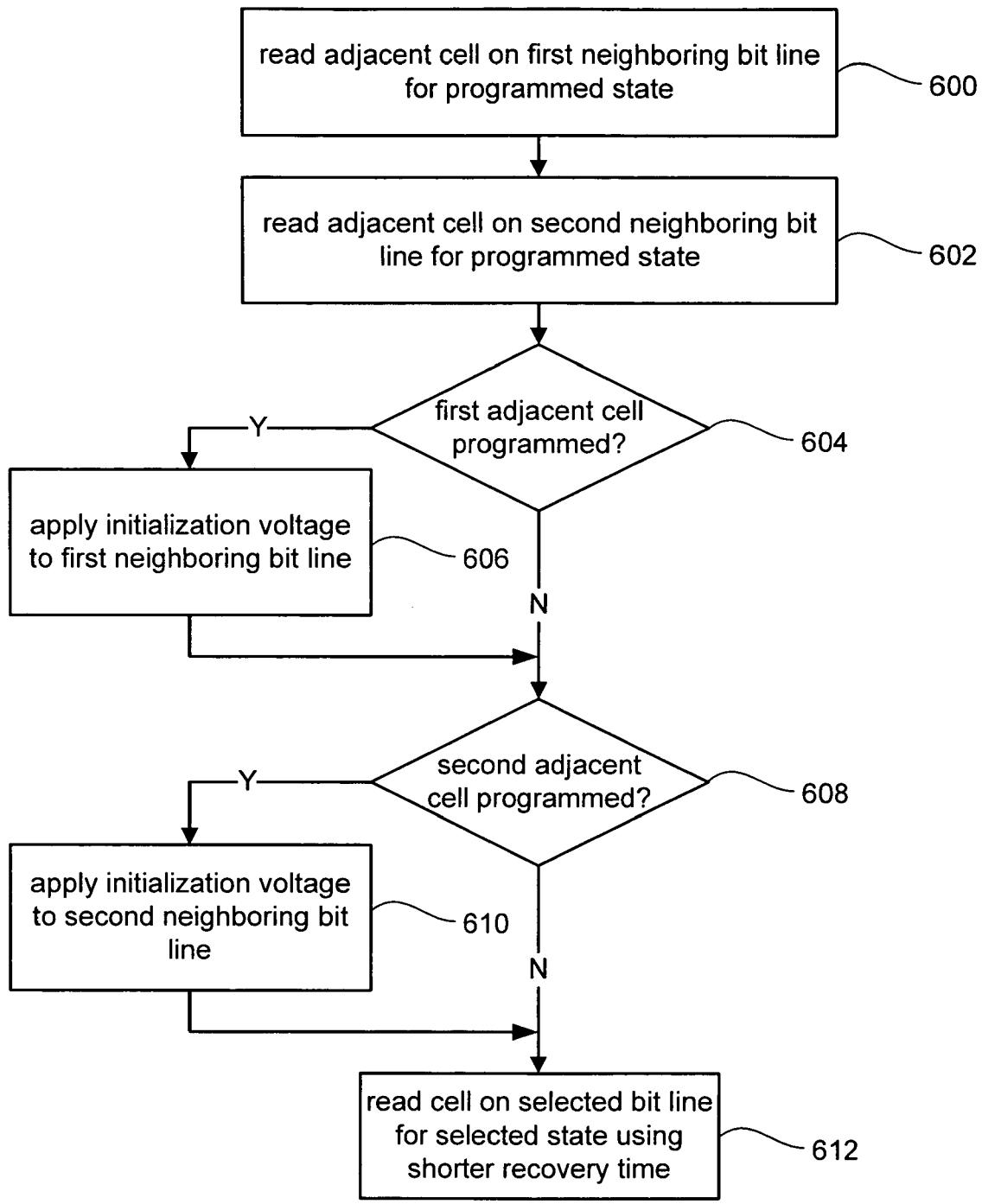
FIG. 23 is a flow chart describing one embodiment of a process for reading data using compensation currents.

FIG. 23 is a flow chart depicting a method in accordance with one embodiment for reading non-volatile memory using compensation currents from one or more neighboring bit lines if necessary. For exemplary purposes, FIG. 23 will be described with respect to the memory system depicted in FIG. 20 although it will be appreciated that other memory architectures can be used. At step 600, the adjacent memory cell on the first bit line neighboring the selected bit line is read to determine if that adjacent memory cell is in a programmed state. For example, memory cell 520 can be read to determine if it is programmed and carrying a positive charge at its floating gate. At step 602, the adjacent memory cell on the second bit line neighboring the selected bit line is read to determine whether it is in a programmed state. For example, memory cell 524 can be read to determine if it is programmed and carrying a positive charge at its floating gate. In one embodiment, steps 600 and 602 are performed simultaneously and may be performed on all memory cells whose control gates are connected to a commonly selected word line. Steps 600 and 602 can include numerous variations in accordance with various embodiments. For example, the reading can be performed to determine if the adjacent memory cells are in one or more states from a set of programmed states. In a binary system, the steps can be performed to determine if the adjacent memory cells are in the sole programmed state. In a multi-state system, steps 600 and 602 could include determining if the adjacent memory cells are programmed to state C in one embodiment. In another embodiment, the steps could determine whether they are programmed to states B or C, states A, B, or C or any variation thereof. In embodiments utilizing other multi-state configurations or additional state levels, additional or alternative programmed states can be considered in steps 600 or 602. The precise state of the memory cell can be determined in steps 600 or 602 (e.g., if a more advanced technique is being used with various initialization voltages and/or sampling periods) or just whether it is at or above a predetermined programmed level.

At step 604, the operation branches based on whether the memory cell on the first neighboring bit line was determined to have been programmed according to the criteria applied at step 600. If the memory cells is programmed, an initialization voltage is applied to the first neighboring bit line at step 606. Because of capacitive coupling between the selected bit line and the first neighboring bit line, a transient current flow from the selected bit line through the first neighboring bit line is induced. At step 608, the operation braches based on whether the memory cell on the second neighboring bit line was determined to have been programmed according to the criteria applied at step 602. If the second memory cell is programmed, an initialization voltage is applied to the second neighboring bit line at step 610. Because of capacitive coupling between the selected bit line and the second neighboring bit line, a transient current flow from the selected bit line through the second neighboring bit line is induced. In one embodiment, steps 606 and 610 are performed simultaneously, and may be performed simultaneously for all bit lines of memory cells connected to the commonly selected word line. At step 612, the memory cell on the selected bit line is read using a shorter recovery time (sampling period moved up in time) as described. If one or more of the neighboring bit lines were provided an initialization voltage to induce a current through the respective neighboring bit line, capacitive coupling will result in displacement currents in the selected bit line. By reading with a shorter recovery time so that the displacement currents coupled from the neighboring bit lines have not yet dissipated, the displacement currents can compensate for any positive charge coupling to the selected memory cell's floating gate from the programmed neighbors.

Many variations exist in accordance with embodiments for performing the various operations of FIG. 23. As already mentioned, steps 600 and 602 can include determining whether a memory cell is programmed to any number of states. Moreover, those steps can include determining the precise state of a memory cell or whether it is merely programmed above a certain predetermined level. In accordance therewith, variations of steps 606, 610, and 612 can be exercised in various embodiments. In one embodiment, steps 606 and 610 include initializing the bit line to the same voltage in every instance. In other embodiments, the initialization voltage applied is selected based on the state of the memory cell determined in step 600 or 602.

Different initialization voltages can be provided rather than just grounding a bit line. The level to which the bit line is initialized will directly affect the difference in voltage between the selected bit line being read and the neighboring bit line. A lower initialization voltage provided to the neighboring bit line results in a larger difference in voltage. A larger difference in voltage between bit lines will induce a larger transient current flow therebetween. Looking at FIG. 21, a lower initialization voltage will shift curve 552 upwards and to the right due to the larger displacement current in the selected bit line. A larger initialization voltage will have the opposite effect.

In one embodiment, the actual state of a memory cell determined at step 600 or 602 is used to apply a particular initialization voltage to the bit line. The initialization voltage applied can be lower when the adjacent memory cell is in a higher programmed state to induce a larger current coupling from the selected bit line. The larger current can compensate for the larger positive charge on the floating gate of the adjacent memory cell that couples to the selected memory cell and causes a reduced conduction current therein.

By way of non-limiting example, consider an embodiment utilizing a controlled bit line voltage of 500 mV for the current sensing technique. If the memory cells are configured to store data in four states (E, A, B, and C), an adjacent memory cell's bit line could be initialized (at step 606 or 610) to ground if the memory cell is programmed to state C, 150 mV if programmed to state B, and 300 mV if programmed to state A. Other variations can exist as will apparent to those of ordinary skill in the art.

Similar to adjusting or selecting the initialization voltage, the sampling period can be selected or adjusted based on the state of an adjacent memory cell. As illustrated in FIG. 22, the sampling period is moved up in time (shorter recovery time) to capture the transient displacement current resulting from the activity on the neighboring bit line. The sampling period can be selected and applied based on the state of the adjacent memory cell so that more or less of the displacement current is present in the selected bit line during sensing. As curve 552 illustrates, the quicker the sampling is done after biasing, the more displacement current will be present in the selected NAND string. Thus, sampling can be performed earlier when the adjacent memory cell is programmed to a higher state and is carrying a larger positive charge at its floating gate. Continuing with a four-state architecture example, individual sampling periods can be established that are dependent upon the actual state of an adjacent memory cell. If the adjacent memory cell is programmed to state A (carrying some but not a large positive charge), the sampling period can be moved up in time by a first amount so that there is small displacement current present in the selected NAND string. If the adjacent memory cell is programmed to state B, the sampling period can be moved up in time further so that more displacement current is present in the selected NAND string. If the adjacent memory cell is programmed to state C, the sampling period can be moved up even further so that a substantial amount of displacement current is present. Various sampling periods can be chosen in accordance with the requirements and needs of a particular implementation.

In various embodiments, combinations of select initialization voltages and/or different sampling periods can be used. For devices including more than four states, additional initialization voltages and/or sampling periods can be used.

Figure 24:
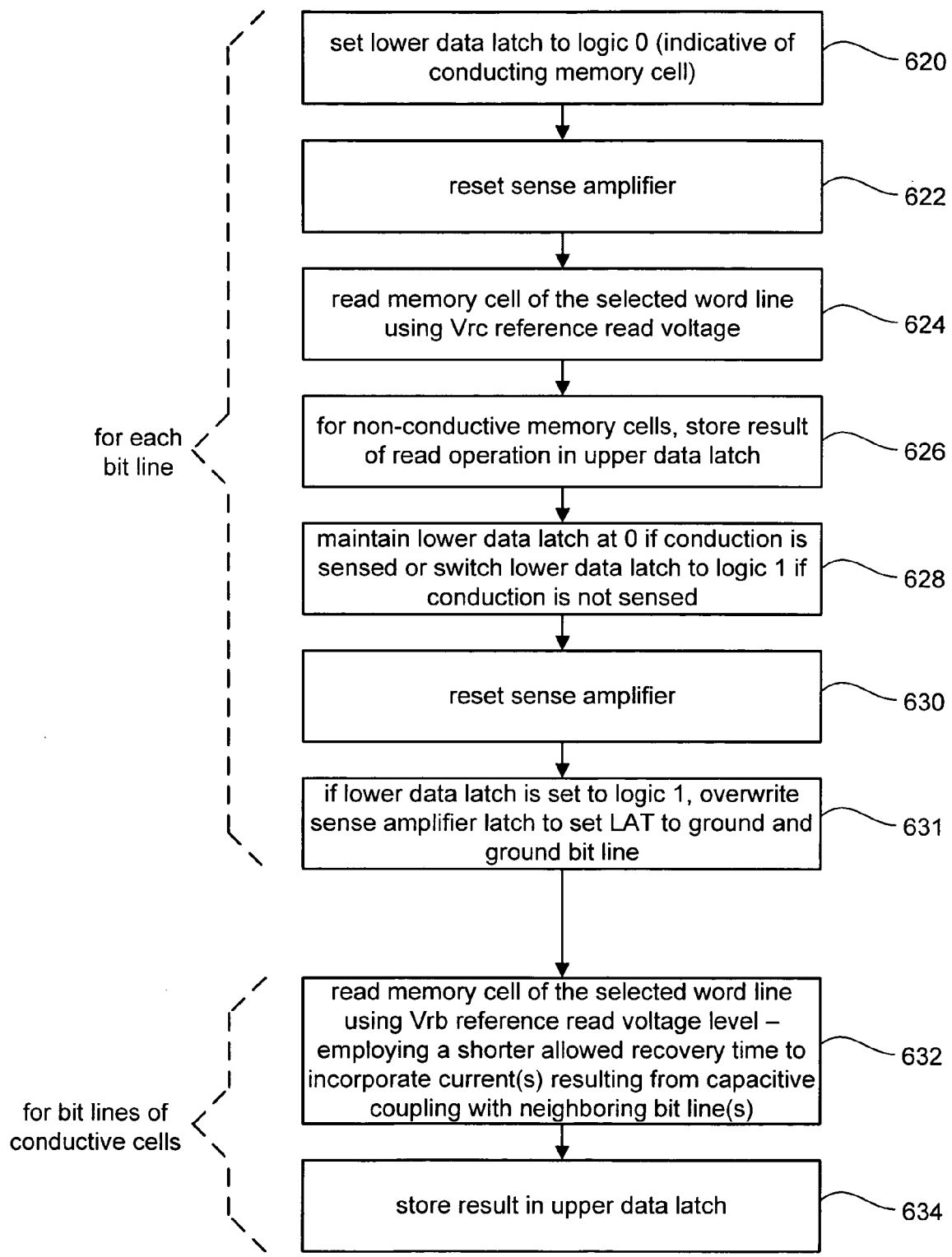
FIG. 24 is a flow chart describing one embodiment of a process for reading data from an upper page in an all bit line architecture.

Numerous variations of the principles embodied in FIG. 23 can be used in accordance with embodiments for application to particular types of memory architectures. Some of these are discussed hereinafter by way of non-limiting examples. FIG. 24 is a flow chart depicting a method in accordance with one embodiment that utilizes the all bit line architecture for performing a read operation. The read operation depicted in FIG. 24 is an exemplary upper page read operation for a four-state memory cell that utilizes a coding scheme where states B and C share the same upper page bit value. The read is done to determine the value of that upper page bit in each memory cell. Referring to FIG. 12, the upper page read is done at the reference read level Vrb to determine whether the memory cell is in one of states E and A or in one of states B and C. A conductive memory cell under application of the Vrb read voltage indicates that the memory cell is in either state E or A, and thus, has its upper page bit is set to one. A non-conductive memory cell under application of the Vrb read voltage indicates that the memory cell is in either state B or C, and thus, has its upper page bit set to zero.

Steps 620–631 are performed simultaneously for every bit line in a block of the memory array being read and correspond to reading the memory cells of a single word line. For each bit line, the steps correspond to reading the memory cell thereof that is connected to the word line being read. In the particular embodiment illustrated, these steps are performed to determine which memory cells on the selected word line are programmed to state C. Those cells determined to be programmed to state C will have their corresponding bit line set to an initialization voltage when reading the remaining cells using the Vrb read level.

At step 620, the lower data latch of data latches 224 for each bit line is set to logic 0 which is indicative of a conducting memory cell. At step 622, the sense amplifier for each bit line is reset. Step 622 can include initializing the sense amplifier by reset signal RST which will raise or charge sense node 244 to Vdd as well as raise the signal LAT to Vdd. In one embodiment, step 622 can correspond to phase 1 of FIG. 15. In Step 624, each memory cell at the selected word line is read using the Vrc reference read voltage to determine whether the memory cell is in state C or a lower state. In one embodiment, step 624 corresponds to phases 2–8 of FIG. 15. In such an embodiment, a two-pass sensing process is used to more accurately sense the state of the selected cells by reducing source line bias through the grounding of the bit lines of more highly conductive memory cells during subsequent sensing phases. In other embodiments, a multiple pass process is not used and a more simple single-pass sensing technique is employed such as by charging the bit line (e.g., phase 3) and performing one sensing operation (e.g., phase 4).

At step 626, the results (or a portion thereof) of the first sensing operation can be stored. Step 626 can include a read out phase as shown in FIG. 15. For example, those cells determined to be non-conductive can have a zero stored in the corresponding upper data latch of latches 224 since its is known as a result of the sensing that the upper page bit for the cell is a logic '0.' Those memory cells that were conductive will not have a value stored in their corresponding upper data latch. This is because it is not yet known whether their upper page bit is a logic '1' or a logic '0.' These cells may in any one of states E, A, and B and the value of their upper page bit will be determined during the sensing in step 632.

If conduction was sensed for a particular bit line, its corresponding lower data latch 224 is maintained at logic '0' at step 628 to indicate a conductive memory cell. If conduction was not sensed for a particular bit line, its corresponding lower data latch is set to logic '1' at step 628 to indicate a non-conductive memory cell. The state of the lower data latch will be used by processor 224 to set the appropriate condition on each bit line during the subsequent sensing operation. The lower data latches are used to store this information since the upper data latches will be used to store the actual upper page data for the sensing operation. In other embodiments, additional data latches can be used in place of the lower data latches. Likewise, if a lower page read is being performed, the upper data latches can be used to store the information needed for determining when to apply an initialization voltage to a bit line and the lower data latches used to store the actual lower page data.

A second read operation at the Vrb level begins after setting the appropriate logic value in each lower data latch. This portion of the method corresponds to the timing diagram of FIG. 20. First, at step 630, each sense amplifier is reset by asserting the RST signal (e.g., phase 1 of FIG. 20). At step 631, for those bit lines having a conductive memory cell, processor 222 reads the '0' from the lower data latch which, according to the direction of state machine 122, indicates that no special action is to be taken. Accordingly, the signal LAT is maintained at Vdd (INV grounded) which results in charging the bit line and internal sense node 244 to Vdd. For those bit lines having a non-conductive memory cell, processor 222 reads the '1' from the lower data latch which indicates that the bit line is to be grounded during the subsequent read operation. Accordingly, processor 222 will overwrite and set an appropriate condition in bit line latch 214 to ground the bit line. By setting the condition in bit line latch 214, the signal LAT is set to ground and consequently, the bit line is grounded.

As a result of grounding a bit line, a current flow will result between the grounded bit line and any neighboring bit lines having memory cells not in state C (INV low so the bit line is charged to Vdd). The resulting displacement current in the bit lines of cells not in state C will act as a compensation current as described in FIGS. 20–22. This compensation current will be exploited during the second read operation at steps 632–634.

Steps 632 and 634 are performed only for those bit lines having a conductive memory cell. The bit lines having a non-conductive memory cell were previously determined to have been in state C. Thus, it is unnecessary to do a read of these memory cells at the Vrb level. However, in other embodiments, steps 632 and 634 can be performed for every bit line. At step 632, each bit line of a conductive memory cell is read at the Vrb read level. Step 632 can be performed as depicted in phases 3 and 4 of FIG. 22. In other embodiments, a multi-pass sensing process can be used at step 632 to gain a more accurate read by reducing or eliminating source line bias during subsequent sensing phases. FLT will be pulled high to begin the sensing process. The time during which FLT is high is adjusted as described in FIG. 21 to provide a shorter recovery time so that the displacement current resulting from capacitive coupling is in the bit line. After reading the memory cells in step 632 and latching the output in bit line latch 214, the results are stored in step 634, which can include the read out phase (5) of FIG. 22.

If a multi-pass sensing technique is performed, the second (or later) sensing phase can include the shorter recovery time as previously described. If a single-pass sensing technique is performed, the single sensing phase can include the shorter recovery time. The displacement current caused by grounding the bit lines of programmed neighboring memory cells will provide the compensation current to the bit lines being read because of capacitive coupling. The compensation current(s) flowing between bit lines results in the respective sense nodes of the sense amps discharging at a faster rate than would occur without the compensation current. The compensation current is intended to be substantially equal to the decreased conduction current of the applicable memory cells which results from capacitive coupling of a portion of the charge stored in the floating gates of any programmed neighboring memory cells. Thus, the compensation current causes the dedicated capacitor 252 to charge at a rate that would normally occur were no neighboring memory cells programmed. Accordingly, a more accurate reading of those cells can be performed by compensating for the decreased discharge rate at the sense node resulting from one or more programmed neighboring memory cells.

As previously mentioned, numerous variations can exist according to the needs of a particular implementation. In one embodiment for example, steps 620–628 can be repeated using additional read reference voltages. If the targeted read at step 632 is to be performed using the Vra read reference voltage for example, steps 620–628 could be repeated to determine which cells are in state B as well as state C. This data could be stored in additional data latches at step 628 and used to initialize the bit lines of those cells to a higher initialization voltage than that of bit lines with a memory cell in state C. A larger initialization voltage can be applied to the bit lines of cells in state B to induce a smaller compensation current in neighboring bit lines. Additionally, the method of FIG. 24 can easily be modified for a lower page read in an embodiment that uses a coding scheme as described in FIGS. 13A–13C. The method is essentially the same since a lower page read in such an embodiment is performed at the Vrb reference read level. In such a scheme, the upper data latches can be used to store the information indicating which cells are determined to be in state C during steps 620–628 since the lower data latches will be used to store the actual data at steps 626 and 634. The method of FIG. 24 could also be modified for a full sequence read operation. For example, when doing a read at the Vra reference level (steps 632–634), steps 620–628 could be performed one or more times to determine which cells are in state B and/or which cells are in state C so that appropriate initialization voltages can be applied. When doing a read at the Vrb reference level (steps 632–634), steps 620–628 could be performed to determine which cells are in state C. Many other variations and alternatives can be made in accordance with other embodiments while still remaining within the scope of the present disclosure.

Figure 25:
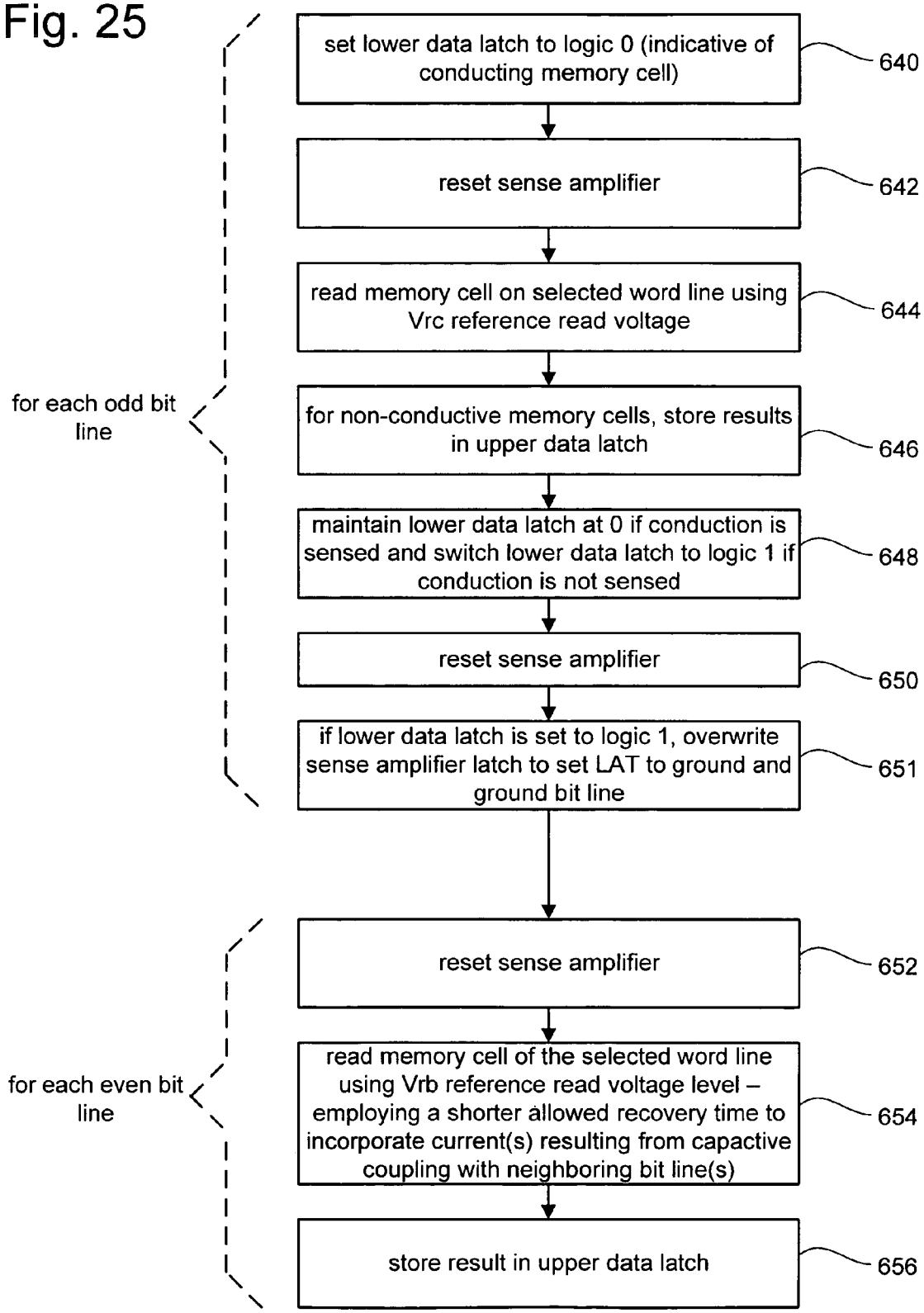
FIG. 25 is a flow chart describing one embodiment of a process for reading data from an upper page in an odd/even bit line architecture.

FIG. 25 depicts a read operation in accordance with another embodiment that utilizes the odd/even bit line architecture. The method of FIG. 25 can be used to read the memory cells along a single word line of a block that are connected to either the odd or even bit lines. Similar to the method of FIG. 24, the method of FIG. 25 is for an upper page read, although lower page or other types of reads (e.g., cells programmed using full sequence) can be performed in accordance with the embodied principles. In FIG. 25, Steps 640–651 are performed for each odd bit line and steps 652–656 are performed for each even bit line. In other embodiments, steps 640–651 could be performed for the even bit lines and steps 652–656 could be performed for the odd bit lines.

The method of FIG. 25 begins at step 640 where the lower data latch of each odd bit line is set to logic '0,' indicative of a conducting memory cell. At step 642, the sense amplifiers for the odd bit lines are reset by raising the RST signal. In response to the reset signal RST, the internal sense node 244 of each sense amplifier is raised to Vdd and the signal LAT is raised to Vdd. At step 644, the memory cells of the selected word line that are connected to the odd bit lines are read using the Vrc read level. As in FIG. 24, step 644 can be performed using a single or multi-pass sensing technique. At step 646, the results of step 644 are stored. For memory cells that were non-conductive under application of the Vrc control gate voltage, a logic '0' can be stored in their corresponding upper data latches to signify that their upper page bit is set to 0. The conductive memory cells connected to the odd bit lines will not have a value stored in step 646. It is only known at this moment that these memory cells are in one of states E, A, and B, and thus, the value of their upper page bit is unknown. At step 648, the value stored in the lower data latches is adjusted depending on the result of the previous read. For the bit line of a non-conductive memory cell, the lower data latch is set to logic '1.' For the bit line of a conductive memory cell, the lower data latch is maintained at logic '0.'

At step 650, a second read operation begins at the Vrb read level. First, the sense amplifiers for each odd bit line are reset at step 650. At step 651, the processor 222 associated with each odd bit line reads the value from the associated lower data latch to determine how each is to be set up for the read. For those odd bit lines having a conductive memory cell, the processor reads the logic '0' and according to the direction of state machine 122, takes no special action. Accordingly, signals LAT and SEN are raised to Vdd which results in charging the internal sense node 244 to Vdd. For those odd bit lines having a non-conductive memory cell, processor 222 reads the logic '1' from the lower data latch which indicates that the bit line is to be grounded during the subsequent read operation. Accordingly, the processor overwrites and sets an appropriate condition in bit line latch 214 to ground the bit line. Subsequently, the signal LAT is set to ground and the bit line is grounded.

After determining whether the memory cell of each odd bit line memory cell is programmed to state C or not, reading the even bit lines at the Vrb read level proceeds. First, the sense amplifiers for each even bit line are reset at step 652. At step 654, the memory cell of each even bit line that is connected to the selected word line is read. A multi-pass sensing technique as described with respect to FIG. 15 or a more simple single-pass technique can be used. For the odd bit lines, those memory cells determined to be non-conductive at the Vrc read level in step 644 had their corresponding bit line grounded at step 650. This results in a current flow from any even bit line having a grounded neighboring odd bit line. The resulting displacement current in the selected even bit lines will act as a compensation current. This compensation current will be exploited during the second read operation at steps 654–656.

The read at step 654 is performed with a shorter recovery time than normal such that a compensation current, resulting from capacitive coupling, is present in the appropriate even bit lines. That is, those even bit lines which are adjacent an odd bit line with a memory cell of the selected word line in state C, will have a compensation current flowing therein during the read operation. After reading the memory cells of the even bit lines using the shorter recovery time, the results are stored in step 656. If a cell is conductive at the Vrb read level, it is determined to have an upper page bit set to '1,' and accordingly, the upper data latch corresponding thereto is set to logic '1.' If a cell is non-conductive at the Vrb read level, it is determined to have an upper page bit set to '0,' and accordingly, the lower data latch corresponding thereto is set to logic '0.'

Figure 26:
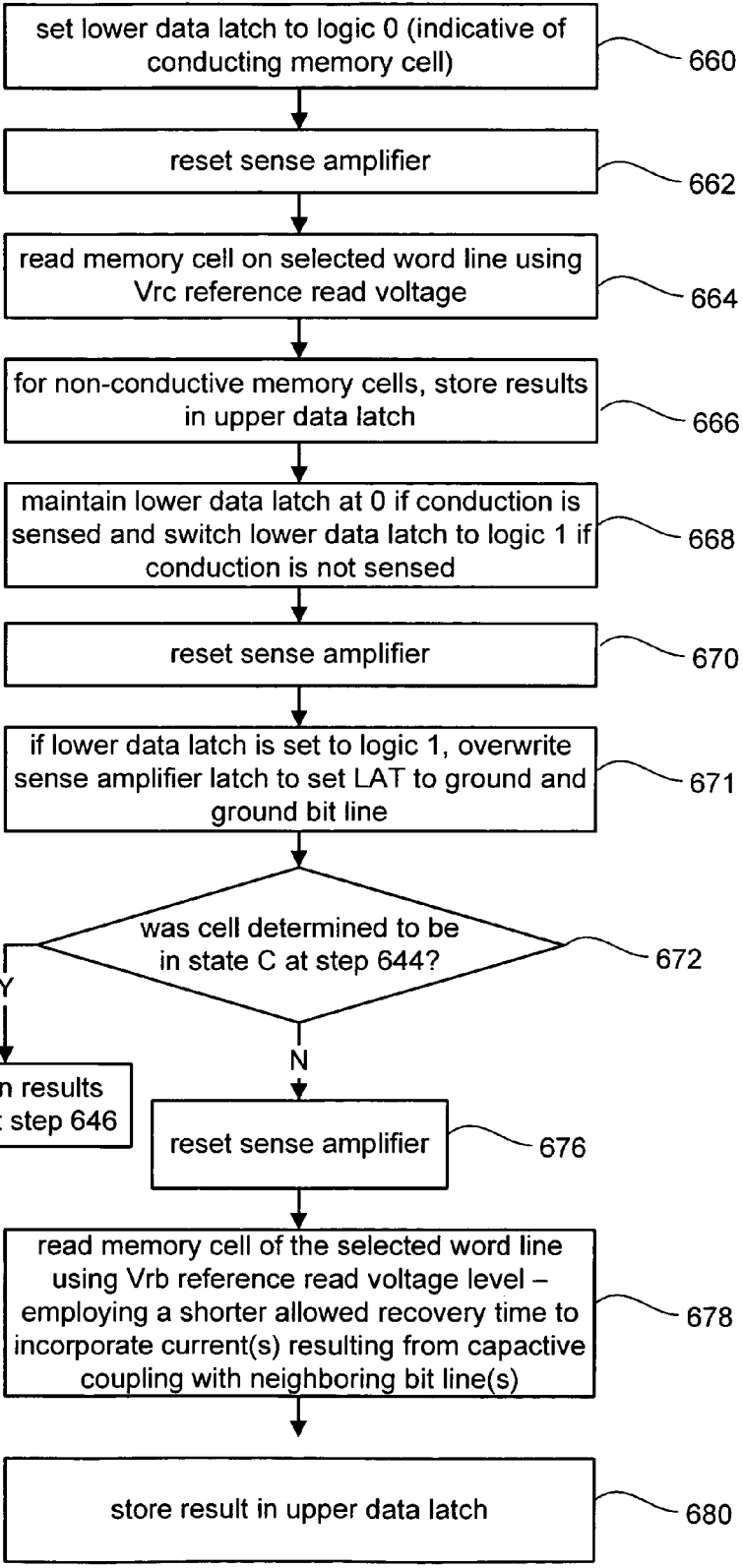
FIG. 26 is a flow chart describing one embodiment of a process for reading data from an upper page in an odd/even bit line architecture.

FIG. 26 is a method in accordance with one embodiment that can be used to perform an upper page read for each odd bit line in an odd/even bit line architecture. In one embodiment, FIG. 26 can be performed after step 656 of FIG. 25 in order to complete a full read of each odd and even bit line for the upper page. Steps 660–671 are performed for each even bit line to determine whether the memory cells of the selected word line are programmed to state C. These steps correspond to steps 640–651 of FIG. 25 which are performed for the odd bit line. The lower latches for each even bit line are set to logic '0,' indicative of a conducting memory cell, at step 660. At step 662, the sense amplifiers are reset, thereby setting the signals SEN and LAT to Vdd to charge the internal sense node 244 to Vdd. At Step 664, each memory cell of an even bit line that is connected to the selected word line is read at the Vrc read level. For those memory cells determined to be non-conductive at step 664, a value of '1' is stored in the appropriate upper data latch at step 666. At step 668, the lower data latches for the even bit lines are set according to the result of the reading at step 664. For conductive memory cells, the lower data latches are maintained at logic '0,' while the lower data latches for the non-conductive memory cells are switched to logic '1.'

The sense amplifiers for each even bit line are reset at step 670 by raising the RST signal. At step 671, for those bit lines with a lower data latch set to logic '1,' the signals LAT and SEN are raised to Vdd, resulting in charging of the internal sense node 244 of the corresponding sense amplifiers to Vdd. For those bit lines with a lower data latch set to logic '0,' the corresponding processors 222 set LAT to ground which results in grounding of those bit lines.

The method then proceeds to steps 672–680, in which the odd bit lines are read at the Vrb read level. In step 672, a determination can be made, from the results of step 644 of FIG. 25, as to whether a memory cell has already been determined to be in state C. If a cell has already determined to be in state C, the results for that memory cell as stored in step 646 of FIG. 25 can be maintained at step 674. For each remaining odd bit line, the method proceeds to step 676 where the corresponding sense amplifier is reset. At step 678 the selected memory cells are read at the Vrb read level. Grounding the bit lines of programmed memory cells will result in compensation currents in each neighboring odd bit line due to capacitive coupling. The odd bit lines are read at step 678 using a shorter recovery time so that the compensation currents are present in the odd bit lines during the sampling period. At step 680, the results of the Vrb level read are stored. Memory cells that are conductive under application of the Vrb read voltage are determined to be in one of states E and A, and thus have an upper page bit set to logic '1.' The upper data latches for each of these memory cells are set to logic '1' at step 680. Memory cells that are not conductive under application of the Vrb read voltage are determined to be in one of states B and C, and thus, have their upper page bit set to logic '0.' The upper data latches for each of these memory cells are set to logic '0' at step 680.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A method of reading data from non-volatile storage, comprising:
    reading a first non-volatile storage element of a first group of non-volatile storage elements to determine whether said first non-volatile storage element is programmed to a first programmed state;
    providing an initialization voltage to a bit line of said first group if said first non-volatile storage element is determined to be in said first programmed state, said providing resulting in a first current in a bit line of a second group of non-volatile storage elements; and
    reading a second non-volatile storage element of said second group while said first current is in said bit line of said second group of non-volatile storage elements if said first non-volatile storage element is programmed to said first programmed state.

2. The method of claim 1, wherein said step of reading said first non-volatile storage element comprises:
    determining whether a threshold voltage of said first non-volatile storage element is at or above a first reference read level corresponding to said first programmed state.

3. The method of claim 1, wherein said step of reading said first non-volatile storage element comprises:
    determining whether a conduction current of said first non-volatile storage is at or above a first breakpoint level corresponding to said first programmed state.

4. The method of claim 1, wherein:
    said step of providing said initialization voltage induces said first current in said bit line of said second group by creating a difference in voltage between said bit line of said first group and said bit line of said second group, said first current flows from said bit line of said second group to said bit line of said first group as a result of capacitive coupling.

5. The method of claim 1, wherein said step of providing includes:
    grounding said first bit line of said first group of non-volatile storage elements.

6. The method of claim 1, wherein:
    said first current in said second bit line increases an apparent conduction current of said second non-volatile storage element.

7. The method of claim 1, wherein said step of reading said second non-volatile storage element includes:
    sensing a conduction current of said second non-volatile storage element during a first sampling period, said first current increases an apparent value of said conduction current.

8. The method of claim 7, further comprising:
    reading said second non-volatile storage element without said first current in said bit line of said second group of non-volatile storage elements if said first non-volatile storage element is not programmed to said first programmed state.

9. The method of claim 8, wherein:
    said reading without said second current in said bit line of said second group is performed during a second sampling period, said first sampling period is before said second sampling period.

10. The method of claim 1, wherein:
    said step of reading said second non-volatile storage element includes sensing whether a voltage level at a sensing circuit for said second group of non-volatile storage elements drops below a predetermined level corresponding to a second programmed state within a first period of time; and
    said first current in said bit line of said second group increases a rate at which said voltage level at said sensing circuit drops during said first period of time.

11. The method of claim 1, wherein:
    said first group of non-volatile storage elements is a first NAND string; and
    said second group of non-volatile storage elements is a second NAND string adjacent to said first NAND string.

12. The method of claim 11, wherein:
    said first non-volatile storage element is coupled to a first word line; and
    said second non-volatile storage element is coupled to said first word line.

13. The method of claim 11, wherein:
    said first non-volatile storage element is coupled to a first word line; and
    said second non-volatile storage element is coupled to a second word line adjacent to said first word line.

14. The method of claim 1, wherein:
    said first programmed state is one of a plurality of states to which said first group of non-volatile storage elements can be programmed; and
    said first programmed state includes a highest threshold voltage range of said plurality of states.

15. The method of claim 1, wherein:
    said step or reading includes determining whether said first non-volatile storage element is programmed to said first programmed state or at least one other programmed state; and
    said step of providing includes providing said initialization voltage to said bit line of said first group if said first non-volatile storage element is programmed to said first programmed state or said at least one other programmed state.

16. The method of claim 1, wherein:

said first programmed state is one of a plurality of states to which said first group of non-volatile storage elements can be programmed;

said initialization voltage is a first initialization voltage;

said step of reading includes determining whether said first non-volatile storage element is programmed to said first programmed state or at least one other programmed state of said plurality of states; and said method further comprises providing a second initialization voltage to said bit line of said first group of non-volatile storage elements if said first non-volatile storage element is programmed to said at least one other programmed state.

17. The method of claim 16, wherein:

a threshold voltage range of said first programmed state is at a higher level than a threshold voltage of said at least one other programmed state; and said first initialization voltage is lower than said second initialization voltage.

18. The method of claim 1, wherein:

said step of reading said second non-volatile storage element is a second reading of said second non-volatile storage element to determine whether said second non-volatile storage element is programmed to a second programmed state; and said step of reading said first non-volatile storage element includes a first reading of said second non-volatile storage element to determine whether said second non-volatile storage element is programmed to said first programmed state.

19. The method of claim 1, wherein:

said first non-volatile storage element and said second non-volatile storage element are part of a set of non-volatile storage elements;

said set of non-volatile storage elements includes a single page of data; and non-volatile storage elements of said set are connected to a first word line and consecutive bit lines.

20. The method of claim 19, wherein:

said set of non-volatile storage elements are read by simultaneously reading said consecutive bit lines;

said reading said first non-volatile storage element is part of a first read of said set of non-volatile storage elements using a first reference read voltage associated with said first programmed state; and said reading said second non-volatile storage element is part of a second read of said set of non-volatile storage elements using a second reference read voltage associated with a second programmed state.

21. The method of claim 1, wherein:

said first non-volatile storage element and said second non-volatile storage element are part of a set of non-volatile storage elements, said first non-volatile storage element is part of a first subset of said set and said second non-volatile storage element is part of a second subset of said set;

non-volatile storage elements of said set are connected to a first word line and consecutive bit lines;

said set of non-volatile storage elements includes a single page of data;

non-volatile storage elements of said first subset of non-volatile storage elements are coupled to a first subset of said consecutive bit lines that includes every other bit line;

non-volatile storage elements of said second subset of non-volatile storage elements are coupled to a second subset of said consecutive bit lines that includes every other bit line; and said first subset of non-volatile storage elements are read and programmed at a different time than said second subset of non-volatile storage elements.

22. The method of claim 1, wherein:

said first non-volatile storage element and said second non-volatile storage element are part of a set of non-volatile storage elements;

non-volatile storage elements of said set are connected to a first word line and consecutive bit lines;

said set of non-volatile storage elements includes a first page of data and a second page of data; and said first and second non-volatile storage elements each store a portion of said first page of data and a portion of said second page of data.

23. The method of claim 22, wherein:

said set of non-volatile storage elements are read by simultaneously reading said consecutive bit lines;

said reading said first non-volatile storage element is part of a first read of said set of non-volatile storage elements using a first reference read voltage associated with said first programmed state; and said reading said second non-volatile storage element is part of a second read of said set of non-volatile storage elements using a second reference read voltage associated with a second programmed state.

24. The method of claim 1, wherein:

said first non-volatile storage element and said second non-volatile storage element are part of a set of non-volatile storage elements, said first non-volatile storage element is part of a first subset of said set and said second non-volatile storage element is part of a second subset of said set;

non-volatile storage elements of said set are connected to a first word line and consecutive bit lines;

said set of non-volatile storage elements includes a first page of data and a second page of data;

said first and second non-volatile storage elements each store a portion of said first page of data and a portion of said second page of data;

non-volatile storage elements of said first subset of non-volatile storage elements are coupled to a first subset of said consecutive bit lines that includes every other bit line; and non-volatile storage elements of said second subset of non-volatile storage elements are coupled to a second subset of said consecutive bit lines that includes every other bit line.

25. The method of claim 1, further comprising:

reading a third non-volatile storage element of a third group of non-volatile storage elements to determine whether said third non-volatile storage element is programmed to said first programmed state; and providing an initialization voltage to a bit line of said third group if said third non-volatile storage element is determined to be in said first programmed state, said providing resulting in a second current in said bit line of said second group;

wherein said reading said second non-volatile storage element comprises reading said second non-volatile storage element while said first current and said second current are in said bit line of said second group of non-volatile storage elements if said third non-volatile storage element is programmed to said first programmed state.

26. A method of reading non-volatile storage, comprising:
determining which non-volatile storage elements of a set of non-volatile storage elements are programmed to a first programmed state, said non-volatile storage elements of said set are coupled to a first word line and consecutive bit lines;
providing an initialization voltage to a bit line of each non-volatile storage element that is programmed to said first programmed state, said providing resulting in a first current in a bit line of each non-volatile storage element that was determined not to be programmed to said first programmed state; and
reading each non-volatile storage element that was determined not to be programmed to said first programmed state while said first currents are in said bit lines of said non-volatile storage elements that were determined not to be programmed to said first programmed state.

27. The method of claim 26, wherein:
said set of non-volatile storage elements includes a single page of data.

28. The method of claim 27, wherein:
said set of non-volatile storage elements is programmed using full-sequence programming.

29. The method of claim 26, wherein:
said set of non-volatile storage elements includes a first page of data and a second page of data;
each non-volatile storage element of said set stores a portion of said first page of data and said second page of data; and
said set of non-volatile storage elements is programmed by programming said first page of data and said second page of data at different times.

30. A non-volatile memory system, comprising:
a first group of non-volatile storage elements coupled to a first bit line;
a second group of non-volatile storage elements coupled to a second bit line; and
at least one sense block in communication with said first group of non-volatile storage elements and said second group of non-volatile storage elements, said at least one sense block:
reads a first non-volatile storage element of said first group of non-volatile storage elements to determine whether said first non-volatile storage element is programmed to a first programmed state,
provides an initialization voltage to said first bit line if said first non-volatile storage element is determined to be in said first programmed state, said initialization voltage results in a first current in said second bit line, and
reads a second non-volatile storage element of said second group while said first current is in said second bit line if said first non-volatile storage element is programmed to said first programmed state.

31. The non-volatile memory system of claim 30, wherein:
said at least one sense block includes a first sense block in communication with said first group of non-volatile storage elements and a second sense block in communication with said second group of non-volatile storage elements;
said first sense block reads said first non-volatile storage element and provides said initialization voltage; and
said second sense block reads said second non-volatile storage element.

32. The non-volatile memory system of claim 30, wherein:
said sense block includes at least one of sense circuitry and a processor.

33. The non-volatile memory system of claim 30, further comprising:
at least one managing circuit in communication with said at least one sense block; and
wherein said at least one sense block is under the control of said at least one managing circuit.

34. The non-volatile memory system of claim 33, wherein:
said at least one managing circuit includes a state machine.

35. A method of reading data from non-volatile storage, comprising:
receiving a request to read a first non-volatile storage element;
reading a second non-volatile storage element adjacent to said first non-volatile storage element in response to said request;
providing an initialization voltage to a bit line of said second non-volatile storage element if said second non-volatile storage element is programmed to at least one predetermined state, said initialization voltage resulting in a first current in a bit line of said first non-volatile storage element; and
reading said first non-volatile storage element while said first current is in said bit line of said first non-volatile storage element.

36. The method of claim 35, wherein:
said request is a request associated with reading said first non-volatile storage element using a first reference read voltage;
said reading said second non-volatile storage element is performed using a second reference read voltage; and
said reading said first non-volatile storage element is performed using said first reference read voltage and is performed after said reading said second non-volatile storage element.

37. The method of claim 36, wherein:
said reading said first non-volatile storage element is a second reading of said first non-volatile storage element; and
said reading said second non-volatile storage element includes a first reading of said first non-volatile storage element using said second reference read voltage.

38. The method of claim 35, wherein:
said bit line of said first non-volatile storage element is an odd bit line; and
said bit line of said second non-volatile storage element is an even bit line.

39. The method of claim 35, wherein:
said bit line of said first non-volatile storage element is an even bit line; and
said bit line of said second non-volatile storage element is an odd bit line.

40. The method of claim 35, wherein:
said at least one predetermined state includes a plurality of states.

41. The method of claim 40, wherein:
said providing comprises providing a same initialization voltage regardless of which state of said plurality of states said second non-volatile storage element is in.

42. The method of claim 40, wherein:

said plurality of states includes at least a first state and a second state; and said step of providing comprises applying a first initialization voltage if said second non-volatile storage element is in said first programmed state and a second initialization voltage if said second non-volatile storage element is in said second programmed state.

43. The method of claim 40, wherein:

said plurality of states includes at least a first state and a second state; and said step of reading said first non-volatile storage element comprises sensing a conduction current of said first non-volatile storage element during a first sampling period if said second non-volatile storage element is programmed to said first state and sensing said conduction current of said first non-volatile storage element during a second sampling period if said second non-volatile storage element is programmed to said second state.

44. The method of claim 35, wherein:

said first non-volatile storage element and said second non-volatile storage element each store a portion of a single page of data.

45. The method of claim 35, wherein:

said first non-volatile storage element and said second non-volatile storage element each store a portion of a first page of data and a portion of a second page of data.

46. The method of claim 35, wherein:

said second non-volatile storage element and said first non-volatile storage element are each coupled to a first word line.

47. The method of claim 35, wherein:

said first non-volatile storage element is coupled to a first word line; and said second non-volatile storage element is coupled to a second word line.

48. The method of claim 35, further comprising:

reading a third non-volatile storage element adjacent to said first non-volatile storage element in response to said request; and providing said initialization voltage to said bit line of said third non-volatile storage element if said third non-volatile storage element is programmed to said at least one predetermined state, said initialization voltage resulting in a second current in said bit line of said first non-volatile storage element;

wherein reading said first non-volatile storage element comprises reading said first non-volatile storage element while said first and second current are in said bit line of said first non-volatile storage element.

49. A non-volatile memory system, comprising:

a first group of non-volatile storage elements coupled to a first bit line;

a second group of non-volatile storage elements coupled to a second bit line; and at least one sense block in communication with said first group of non-volatile storage elements and said second group of non-volatile storage elements, said at least one sense block:

receives a request to read a first non-volatile storage element of said first group, reads at least one second non-volatile storage element of said second group in response to said request, provides an initialization voltage to said second bit line if said second non-volatile storage element is programmed to at least one predetermined state, said initialization voltage resulting in a first current in said first bit line, and reads said first non-volatile storage element while said first current is in said first bit line.

50. The non-volatile memory system claim 49, wherein:

said at least one predetermined state includes a plurality of states.

51. The non-volatile memory system of claim 50, wherein:

said providing comprises providing a same initialization voltage regardless of which state of said plurality of states said second non-volatile storage element is in.

52. The non-volatile memory system of claim 50, wherein:

said plurality of states includes at least a first state and a second state; and said step of providing comprises applying a first initialization voltage if said second non-volatile storage element is in said first programmed state and a second initialization voltage if said second non-volatile storage element is in said second programmed state.

53. The non-volatile memory system of claim 49, wherein:

said second non-volatile storage element and said first non-volatile storage element are each coupled to a first word line.

54. The non-volatile memory system of claim 49, wherein:

said at least one sense block includes a first sense block in communication with said first group of non-volatile storage elements and a second sense block in communication with said second group of non-volatile storage elements;

said first sense block reads said first non-volatile storage element and provides said initialization voltage; and said second sense block reads said second non-volatile storage element.

55. The non-volatile memory system of claim 49, wherein:

said sense block includes at least one of sense circuitry and a processor.

56. The non-volatile memory system of claim 49, further comprising:

at least one managing circuit in communication with said at least one sense block;

wherein said at least one sense block is under the control of said at least one managing circuit.

* * * * *